(12) United States Patent
Shibib et al.

(10) Patent No.: US 11,295,949 B2
(45) Date of Patent: Apr. 5, 2022

(54) VIRTUAL WAFER TECHNIQUES FOR FABRICATING SEMICONDUCTOR DEVICES

(71) Applicant: Siliconix Incorporated, San Jose, CA (US)

(72) Inventors: M. Ayman Shibib, San Jose, CA (US); Kyle Terrill, San Jose, CA (US)

(73) Assignee: Vishay Siliconix, LLC, San Jose, CA (US)

( * ) Notice: Subject to any disclaimer, the term of this patent is extended or adjusted under 35 U.S.C. 154(b) by 0 days.

(21) Appl. No.: 16/372,381

(22) Filed: Apr. 1, 2019

(65) Prior Publication Data
US 2020/0312657 A1    Oct. 1, 2020

(51) Int. Cl.
*H01L 21/02* (2006.01)
*H01L 21/683* (2006.01)
*H01L 29/04* (2006.01)
*H01L 29/66* (2006.01)

(52) U.S. Cl.
CPC .. *H01L 21/02381* (2013.01); *H01L 21/02532* (2013.01); *H01L 21/02576* (2013.01); *H01L 21/02634* (2013.01); *H01L 21/02664* (2013.01); *H01L 21/6835* (2013.01); *H01L 29/045* (2013.01); *H01L 29/66734* (2013.01); *H01L 2221/6835* (2013.01); *H01L 2221/68381* (2013.01)

(58) Field of Classification Search
None
See application file for complete search history.

(56) References Cited

U.S. PATENT DOCUMENTS

| | | | | |
|---|---|---|---|---|
| 3,721,588 | A * | 3/1973 | Hays | H01L 21/76297 438/413 |
| 5,134,448 | A * | 7/1992 | Johnsen | H01L 21/743 257/330 |
| 6,236,083 | B1 * | 5/2001 | McLachlan | H01L 29/7802 257/328 |
| 2002/0060340 | A1 | 5/2002 | Deboy et al. | |
| 2004/0124445 | A1 * | 7/2004 | Ogino | H01L 21/2205 257/273 |
| 2005/0167742 | A1 * | 8/2005 | Challa | H01L 29/66734 257/328 |
| 2007/0298591 | A1 | 12/2007 | Cha | |
| 2009/0179259 | A1 * | 7/2009 | Wang | H01L 21/76254 257/330 |

(Continued)

FOREIGN PATENT DOCUMENTS

| | | |
|---|---|---|
| CN | 104810282 | 7/2015 |
| DE | 112016001962 | 1/2018 |

(Continued)

OTHER PUBLICATIONS

Addison Engineering, Inc., "Request Quote for Silicon Wafer," https://www.addisonengineering..com/silicon-wafer-quote.

(Continued)

*Primary Examiner* — Nilufa Rahim

(57) ABSTRACT

A method of fabricating semiconductor devices including epitaxially depositing a heavily doped substrate layer that is substantially free of crystalline defects on a lightly doped virtual substrate. The device regions of the semiconductor devices can be fabricated about the heavily doped substrate layer before the lightly doped virtual substrate is removed.

18 Claims, 19 Drawing Sheets

(56) References Cited

U.S. PATENT DOCUMENTS

| | | | |
|---|---|---|---|
| 2009/0179829 A1 | 7/2009 | Nakata et al. | |
| 2011/0250739 A1* | 10/2011 | Falster | H01L 21/2205 438/488 |
| 2012/0080749 A1* | 4/2012 | Purtell | H01L 29/7813 257/334 |
| 2014/0057402 A1* | 2/2014 | Guha | H01L 21/8222 438/237 |
| 2014/0159150 A1* | 6/2014 | Kirisawa | H01L 29/66128 257/335 |
| 2015/0325440 A1* | 11/2015 | Schulze | H01L 21/26506 257/499 |
| 2016/0336392 A1 | 11/2016 | Tominaga et al. | |
| 2017/0018457 A1* | 1/2017 | Schulze | H01L 29/0615 |
| 2018/0226533 A1* | 8/2018 | Lochtefeld | H01L 31/1804 |
| 2018/0323261 A1* | 11/2018 | Kawai | H01L 29/456 |
| 2019/0035909 A1* | 1/2019 | Schmidt | C30B 31/22 |

FOREIGN PATENT DOCUMENTS

| | | |
|---|---|---|
| WO | 2010021623 | 2/2010 |
| WO | 2013003522 | 1/2013 |

OTHER PUBLICATIONS

Wafer World Incorporated, "Request a Quote," https://www.waferworld.com/request-a-quote/.

MicroChemicals, "Silicon Ingot Production Process for Wafers," https://www.microchemicals.com/technical_information/czochralski_floatzone_silicon_ingot_production.pdf.

Silicon Valley Microelectronics, "SVM Float Zone Wafer Sample Specification," https://www.svmi.com/silicon-wafers/float-zone-wafers.

Global Wafer Japan, "Production Methods of Single Crystal Silicon Ingots," https://www.sas-globalwafers.co.jp/eng/products/wafer/crystal.html.

May, Gary et al., "Fundamentals of Semiconductor Fabrication", 2004, pp. 17-39 John Wiley & Sons, Inc.

Van Zant, Peter, "Microchip Fabrication," Fifth Edition, 2004, pp. 51-69, The McGraw-Hill Companies, Inc.

Williams Richard K et al., "The Trench Power Mosfet: Part 1—History, Technology, and Prospects", IEEE Transactions on Electron Devices, IEEE Service Center, Pisacataway, NJ, US, vol. 64, No. 3, Mar. 2017 (Mar. 2017), pp. 674-691, Chapter 'E, Substrat Engineering'.

* cited by examiner

VIRTUAL WAFER TECHNIQUES FOR FABRICATING SEMICONDUCTOR DEVICES

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is the power transistor. The power transistor can include a single transistor occupying most of a semiconductor die. The power transistor is utilized to conduct relatively large currents, and therefore utilizes a heavily doped semiconductor substrate, which reduces the bulk resistance of the semiconductor substrate.

During fabrication of a semiconductor ingot or boule, donor impurity atoms, such as Boron (B) or Phosphorous (P), can be added to molten intrinsic semiconductor material, such as Silicon (Si), in precise amounts to produce a n-type or p-type extrinsic semiconductor respectively. The resulting ingot can then be sliced into a plurality of semiconductor wafers. During the semiconductor ingot growth, small traces of Oxygen (O) can be present in the reaction chamber or introduced by the phosphorous doping source. The oxygen atoms can conglomerate with the excess phosphorus to form defects in the semiconductor lattice structure.

Referring to FIGS. 1A and 1B, an exemplary semiconductor device fabrication process, in accordance with the conventional art, is shown. The semiconductor device fabrication process can require the use of a heavily n-doped semiconductor substrate 110, such as silicon heavily doped with phosphorous. The silicon substrate heavily doped with phosphorous, utilized in the commercial fabrication of semiconductor devices, can have one or more types of point defects 120, 130 within the lattice structure of the semiconductor substrate 110, as illustrated in FIG. 1A. For example, phosphorous and oxygen can combine as Phosphorus Pentoxide ($P_2O_5$) and generate point defects in the semiconductor substrate 110. Various semiconductor fabrication techniques are then utilized to fabricate one or more regions of one or more devices about the surface of the heavily doped semiconductor substrate 110, as illustrated in FIG. 1B. Point defects at or near the surface of the semiconductor substrate 110 can cause a reduction of the breakdown voltage and or excessive leakage current in the one or more devices fabricated on the substrate. Other dopants, such as Arsenic (As) can result in similar point defect based voltage breakdown failure mechanisms and or excessive leakage current. The breakdown voltage failure mechanism and or increased leakage current can degrade the performance and or cause reliability issues in low on-resistance semiconductor devices such as Trench Metal Oxide Semiconductor Field Effect Transistors (TMOSFETs), Vertical MOSFET (VMOS), Vertical Diffused MOSFET (VDMOS), Double-Diffused (DMOS), Power MOSFET (UMOS), and the like. Accordingly, there is a continuing need for improved semiconductor manufacturing techniques.

SUMMARY OF THE INVENTION

The present technology may best be understood by referring to the following description and accompanying drawings that are used to illustrate embodiments of the present technology directed toward techniques for fabricating a heavily doped substrate, that is substantially defect free, for use in fabricating semiconductor devices.

In one embodiment, a method of fabricating a semiconductor device can include depositing a heavily doped crystalline substrate on a lightly doped crystalline virtual substrate. One or more regions of one or more devices can be formed in and on the heavily doped crystalline substrate. The lightly doped crystalline virtual substrate can then be removed leaving the one or more regions of the one or more devices formed in and on the heavily doped crystalline substrate.

In another embodiment, a method of fabricating a semiconductor device can include epitaxially depositing a heavily n-doped substrate layer on a lightly n-doped virtual substrate. One or more regions of one or more devices can be formed about a surface of the heavily n-doped substrate layer. The lightly n-doped virtual substrate can be removed from the heavily n-doped substrate after forming the one or more regions of the one or more devices.

In yet another embodiment, a method of fabricating a semiconductor device can include depositing a buffer layer on a crystalline virtual substrate. A heavily doped crystalline substrate can then be deposited on the buffer layer. The butter layer can be configured to prevent propagation of defects from the crystalline virtual substrate into the heavily doped crystalline substrate. One or more regions of one or more device can be formed about the surface of the heavily doped crystalline substrate before the crystalline virtual substrate and optionally the buffer layer are removed.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
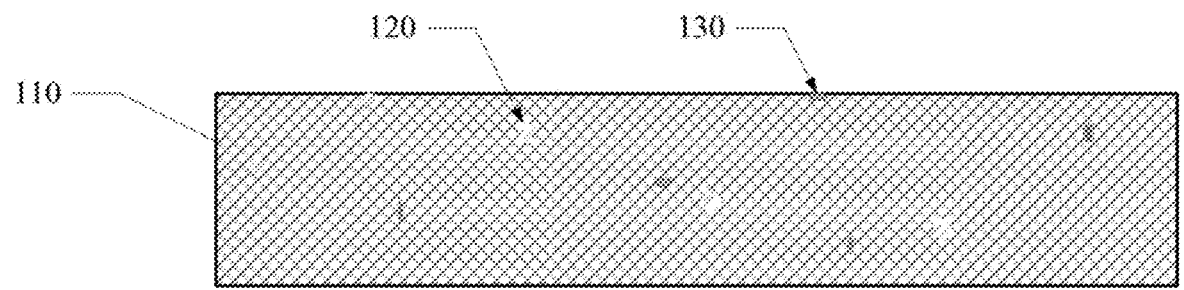
FIGS. 1A and 1B show an exemplary semiconductor device fabrication process, in accordance with the conventional art.
Figure 1B:
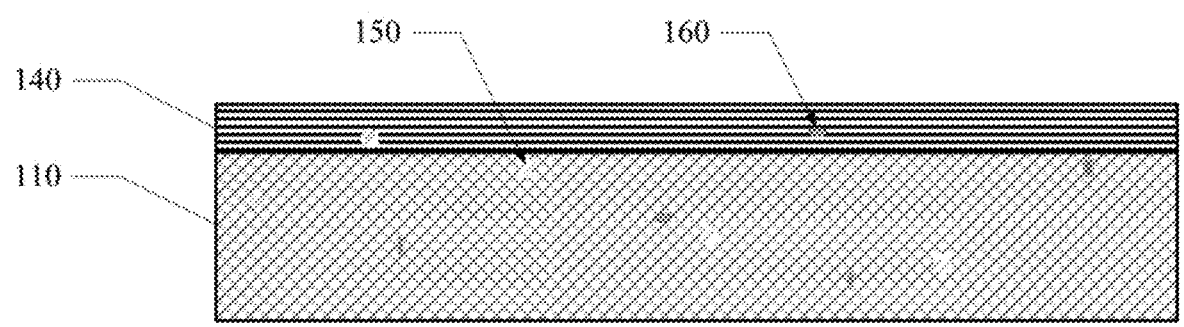

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving." and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
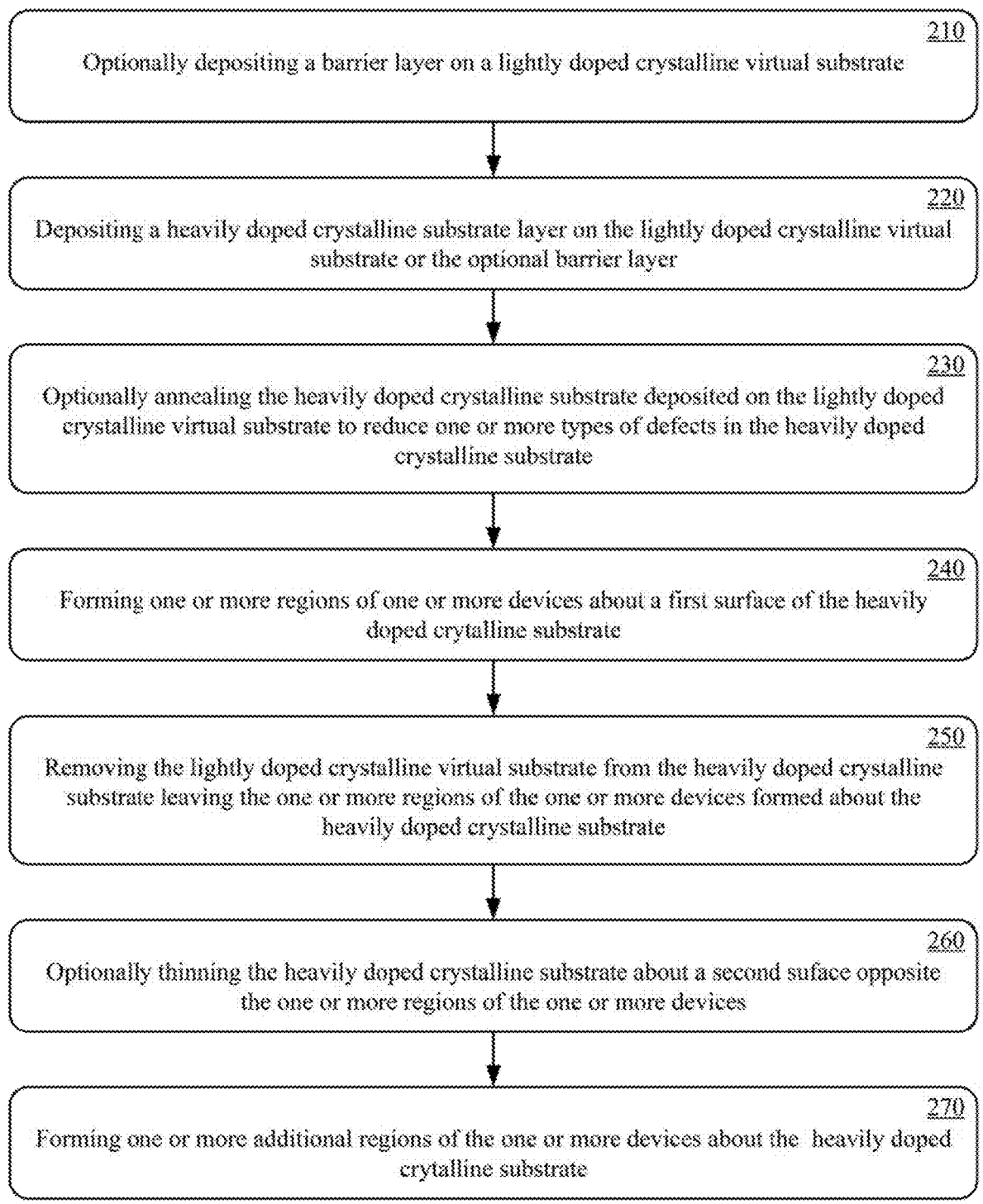
FIG. 2 shows a method of fabricating a semiconductor device, in accordance with aspects of the present technology.
Figure 3A:
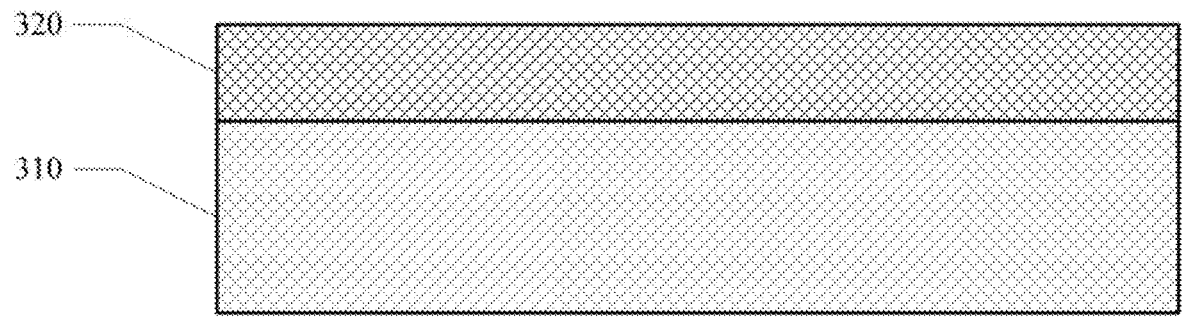
FIGS. 3A, 3B and 3C show an exemplary semiconductor device fabrication process, in accordance with aspects of the present technology.
Figure 3B:
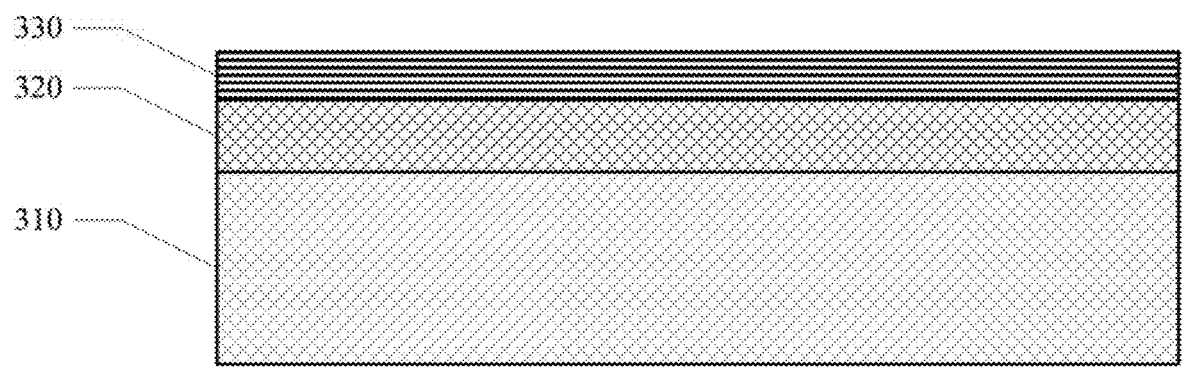
Figure 3C:
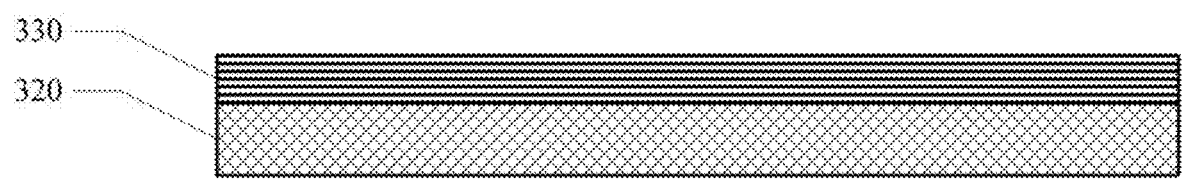

Referring now to FIG. 2, a method of fabricating a semiconductor device, in accordance with aspects of the present technology, is shown. The fabrication method will be further described with reference to FIGS. 3A, 3B and 3C. The method of fabricating a semiconductor device can include optionally depositing a barrier layer (not shown) on a lightly doped crystalline virtual substrate 310, at 210. The barrier layer can be configured to reduce doping diffusion from a subsequently described heavily doped crystalline substrate layer 310 to the lightly doped crystalline virtual substrate 320. At 220, a heavily doped crystalline substrate layer 320 can be deposited on the lightly doped crystalline virtual substrate 310, or on the barrier layer if included. The term virtual substrate is used herein to convey that the virtual substrate is used to deposit the heavily doped crystalline substrate layer thereupon, and then is subsequently removed before fabrication of the semiconductor device is completed, as further described below. The lightly doped crystalline virtual substrate 310 can be substantially free of point defects.

In one implementation, the lightly doped crystalline virtual substrate 310 can be a silicon wafer lightly doped with phosphorous. The silicon wafer lightly doped with phosphorous can have a wafer thickness of approximately 625 micrometers ($\mu$m) and a resistivity of approximately a few milli-Ohms centimeter (m$\Omega \cdot$cm) or less. The silicon wafer lightly doped with phosphorous can have a very low point defect density. In comparison, a silicon wafer used in the conventional art of comparable cost that is heavily doped with phosphorous, with a resistivity below m$\Omega \cdot$cm, can have a substantially higher point defect density due to the precipitation of oxygen atoms with the abundantly present phosphorus in the substrate.

In one implementation, the heavily doped crystalline substrate 320 can be formed by epitaxially depositing silicon in the presence of phosphorous doping utilizing Chemical Vapor Deposition, Vapor-Phase Epitaxy (VPE), Liquid-Phase Epitaxy (LPE), Molecular Beam Epitaxy (MBE), or other similar epitaxy process. For example, a gas of Silicon Tetrachloride ($SiCh_4$), Silane ($SilH_4$), dichlorosilane ($SiH_2C_2$), trichlorosilane ($SiHCl_3$) or the like, along with an impurity gas of Phosphine ($PH_3$) or the like can be used in VPE at a temperature of approximately 1200° Celsius (C) to deposit a silicon epitaxy layer heavily doped with phosphorous on the silicon lightly doped with phosphorous virtual substrate. The epitaxial process can be performed to deposit a silicon epitaxial layer heavily doped with phosphorus to a resistivity of less than 1 m$\Omega \cdot$cm, and a thickness of approximately 20-50 $\mu$m, on the silicon lightly doped with phosphorous virtual substrate.

At 230, the heavily doped crystalline substrate layer 320 deposited on the lightly doped crystalline virtual substrate 310 can optionally be annealed to reduce one or more types of defects in the heavily doped crystalline substrate layer 320. In one implementation, the silicon lightly doped with phosphorous virtual substrate and the epitaxially deposited silicon heavily doped with phosphorous can be subjected to a thermal cycle of approximately 1000° C. to reduce one or more types of defects in the deposited silicon heavily doped with phosphorus substrate layer.

At 240, one or more regions of one or more devices 330 can be formed about an exposed surface of the heavily doped crystalline substrate layer 320. In one implementation, one or more semiconductor fabrication techniques, such as epitaxial deposition, photolithography, etching, implanting, deposition, and the like can be performed to form one or more regions of one or more devices 330, such as drain regions, drift regions, body regions, source regions, gate regions, gate dielectric regions, contacts, vias and or the like of one or more transistors or other similar devices, in and on the surface of the deposited silicon heavily doped with phosphorus substrate layer.

At 250, the lightly doped crystalline virtual substrate 310 can be removed from the heavily doped crystalline substrate layer 320 leaving the one or more regions of the one or more devices 330 formed about the heavily doped crystalline substrate layer 320. In one implementation, the lightly doped crystalline virtual substrate 3310 can be removed by a back grinding and polishing process. At 260, the heavily doped crystalline substrate layer 320 can optionally be thinned. In one implementation, the back grinding and polishing process can also be utilized to remove a portion of the heavily doped crystalline substrate layer 320 from the exposed surface opposite the one or more region of the one or more devices 330. The heavily doped crystalline substrate layer 320 can be thinned to a final thickness of approximately 20-50 µm.

At 270, the method of fabricating a semiconductor device can proceed with forming one or more additional regions of the one or more devices 330 about the exposed surface of the heavily doped crystalline substrate layer 320. In one implementation, one or more additional semiconductor fabrication techniques, such as photolithography, etching, implanting, deposition, and the like can be performed to form one or more regions of one or more devices 330, such as encapsulation layers, leads and or the like of one or more transistors or other similar devices, in and on the surface of the heavily doped crystalline substrate layer.

Figure 4A:
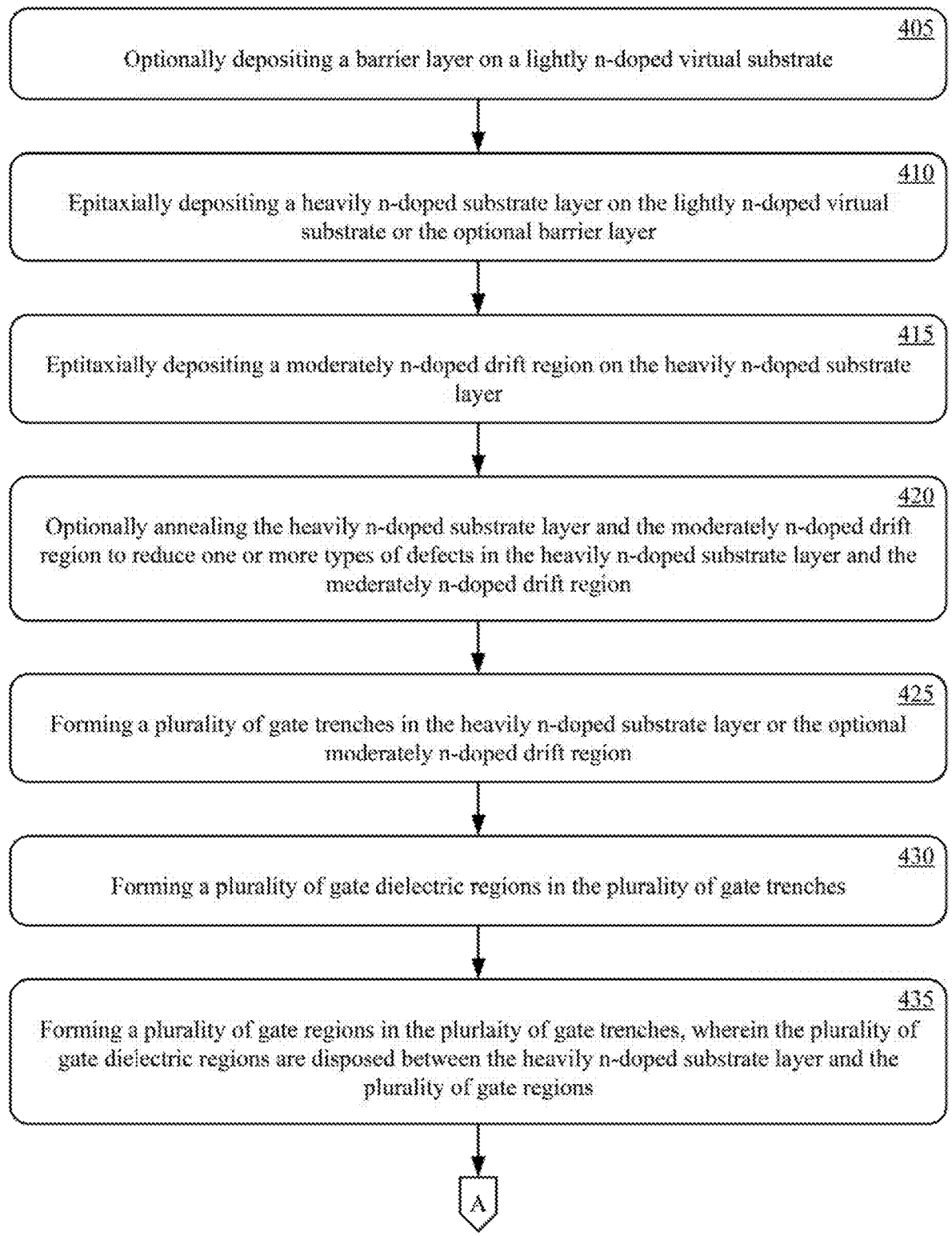
FIGS. 4A and 4B show a method of fabricating a vertical power device, in accordance with aspects of the present technology.
Figure 4B:
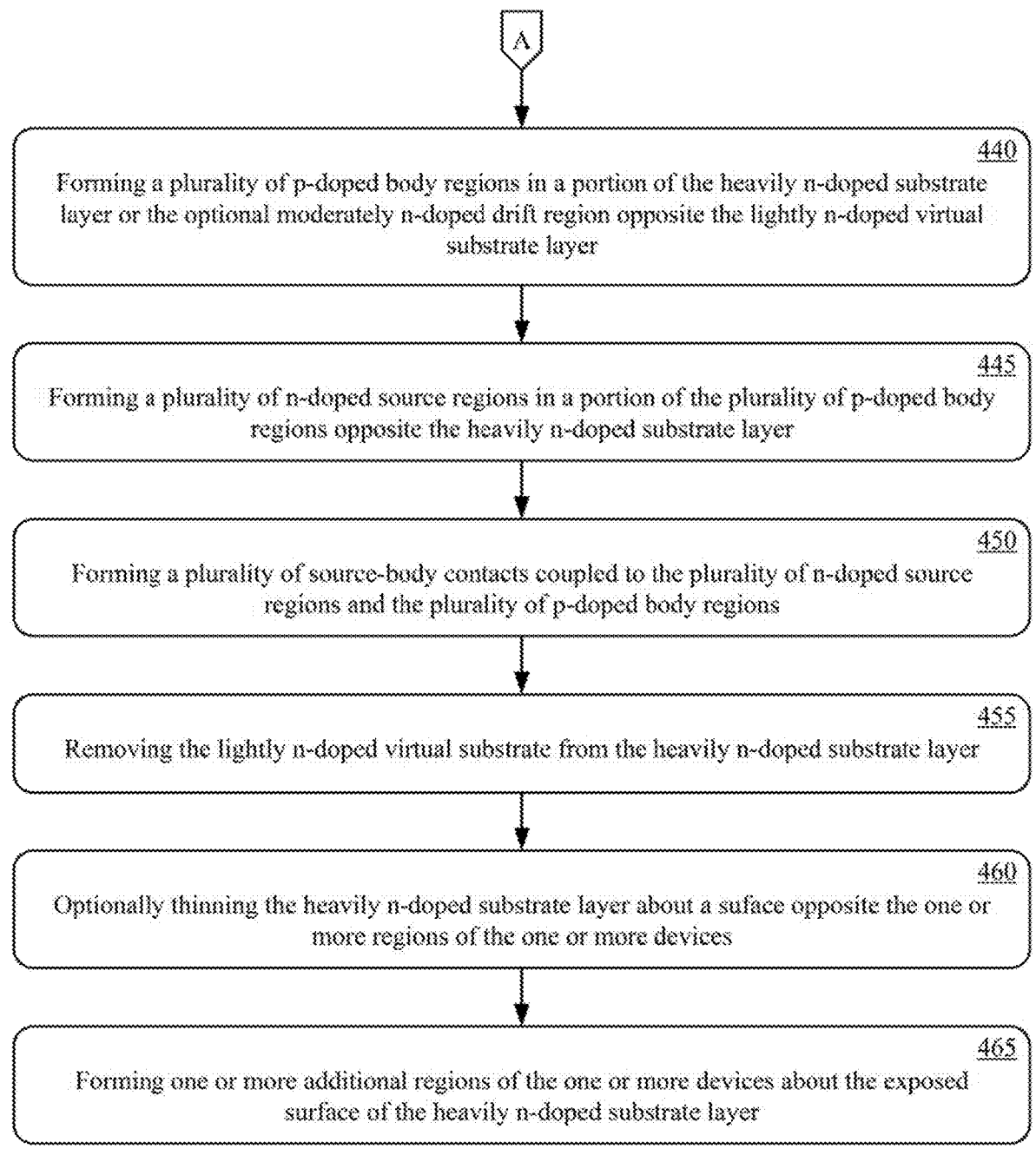

Referring now to FIGS. 4A and 4B, a method of fabricating an exemplary vertical power device, in accordance with aspects of the present technology, is shown. The fabrication method will be further described with reference to FIGS. 5A through 5K, which show portions of an exemplary vertical power device during various stages of fabricating. The vertical power device, in one implementation, can be a Trench Metal Oxide Semiconductor Field Effect Transistor (TMOSFET). The method of fabricating a vertical power device can include optionally depositing a barrier layer (not shown) on a lightly n-doped virtual substrate 502, at 405. The barrier layer can be configured to reduce doping diffusion from a subsequently described heavily doped crystalline substrate layer 504 to the lightly doped crystalline virtual substrate 502. In one implementation, the barrier layer can be a thin layer of Arsenic (As) or Phosphorus (P). At 410, a heavily n-doped substrate layer 504 can be epitaxially deposited on a lightly n-doped crystalline virtual substrate 502 or the optional buffer layer. The term virtual substrate is used herein to convey that the virtual substrate is used to epitaxially grow the heavily doped crystalline substrate layer thereupon, and then is subsequently removed from the finished semiconductor device as further described below. The lightly n-doped crystalline virtual substrate 502 can be substantially free of point defects.

In one implementation, the lightly n-doped crystalline virtual substrate 502 can be a silicon wafer lightly doped with phosphorous. The silicon wafer lightly doped with phosphorous can have a wafer thickness of approximately 625 µm and a resistivity of approximately a few milli-Ohms centimeter (mΩ·cm) or less. In comparison, a silicon wafer of comparable cost that is heavily doped with phosphorous, with a resistivity below 1 (mΩ·cm), can have a substantially higher point defect density due to the precipitation of oxygen atoms with the abundantly present phosphorus in the substrate.

In one implementation, the heavily n-doped crystalline substrate 504 can be formed by epitaxially depositing silicon in the presence of phosphorous doping utilizing Chemical Vapor Deposition, Vapor-Phase Epitaxy (VPE), Liquid-Phase Epitaxy (LPE), Molecular Beam Epitaxy (MBE), or other similar epitaxy process. For example, a gas of Silicon Tetrachloride (SiCl$_4$), Silane (SiH$_4$), dichlorosilane (SiH$_2$Cl$_2$), trichlorosilane (SiHCl$_3$) or the like, along with an impurity gas of Phosphine (PH$_3$) or the like can be used in VPE at a temperature of approximately 1200° C. to deposit a silicon epitaxy layer heavily doped with phosphorous on the silicon lightly doped with phosphorous virtual substrate. In one implementation, an Arsenic (As) buffer layer can be deposited on the lightly n-doped crystalline virtual substrate 502 before the heavily n-doped crystalline substrate 504 is epitaxially deposited to control out-diffusion of the n-doping form the heavily n-doped crystalline substrate 504 to the lightly n-doped crystalline virtual substrate 502 to improve control of the doping concentration and or doping profile in the heavily n-doped crystalline substrate 504. The epitaxial process can be performed to deposit a silicon epitaxial layer heavily doped with phosphorus to a resistivity of less than 1 mΩ·m, and a thickness of approximately 20-50 µm on the silicon lightly doped with phosphorous virtual substrate.

At 415 a moderately n-doped crystalline layer 506 can be epitaxially deposited on the heavily n-doped substrate layer 504. The moderately n-doped crystalline layer can be configured to be a drift region. In one implementation, the moderately n-doped crystalline layer can be an epitaxially deposited silicon layer moderately doped with Phosphorous (P).

At 420, the heavily n-doped crystalline substrate layer 504 and the moderately n-doped drift region 506 can optionally be annealed to reduce one or more types of defects in the heavily n-doped crystalline substrate layer 504 and the moderately n-doped drift region 506. In one implementation, the silicon lightly doped with phosphorous virtual substrate 502, the epitaxial deposited silicon heavily doped with phosphorous substrate 504 and the epitaxial deposited silicon moderately doped with phosphorous drift region 506 can be subjected to a thermal cycle of approximately 1000° C. to reduce one or more types of defects in the epitaxial deposited silicon heavily doped with phosphorus substrate layer 504 and epitaxial deposited silicon moderately doped with phosphorous drift region 506.

Figure 5A:
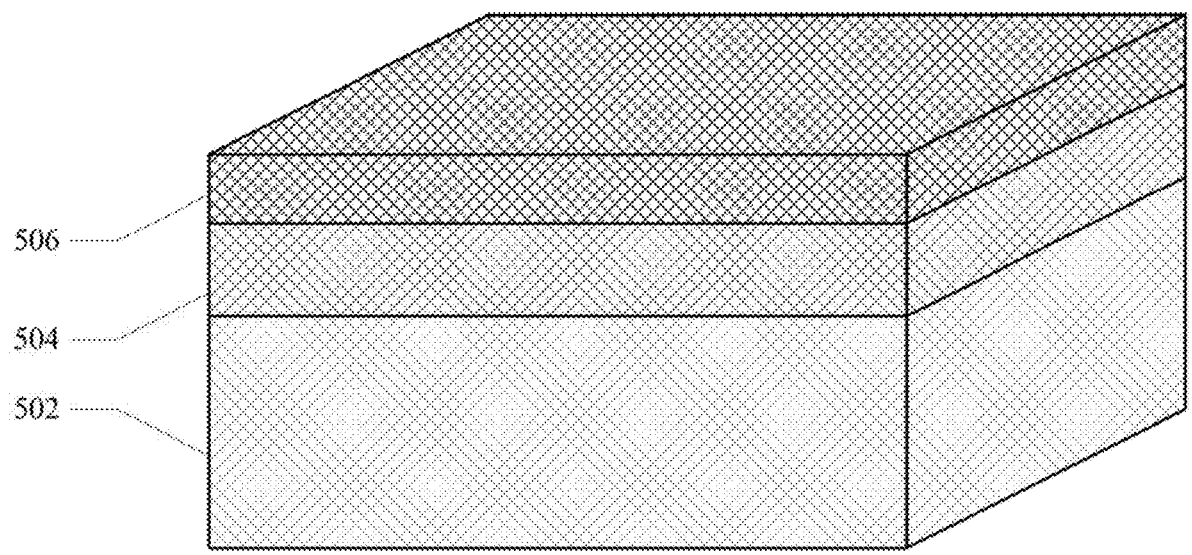
FIGS. 5A through 5K show an exemplary vertical power device fabrication process, in accordance with aspects of the present technology.
Figure 5B:
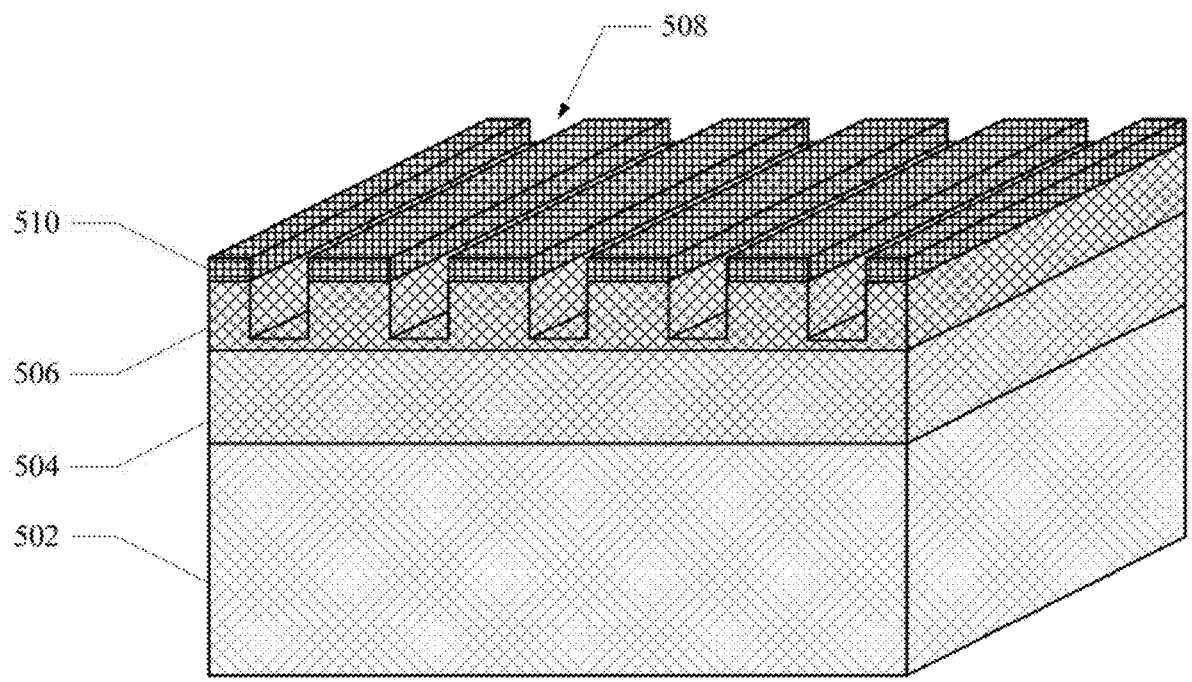
Figure 5C:
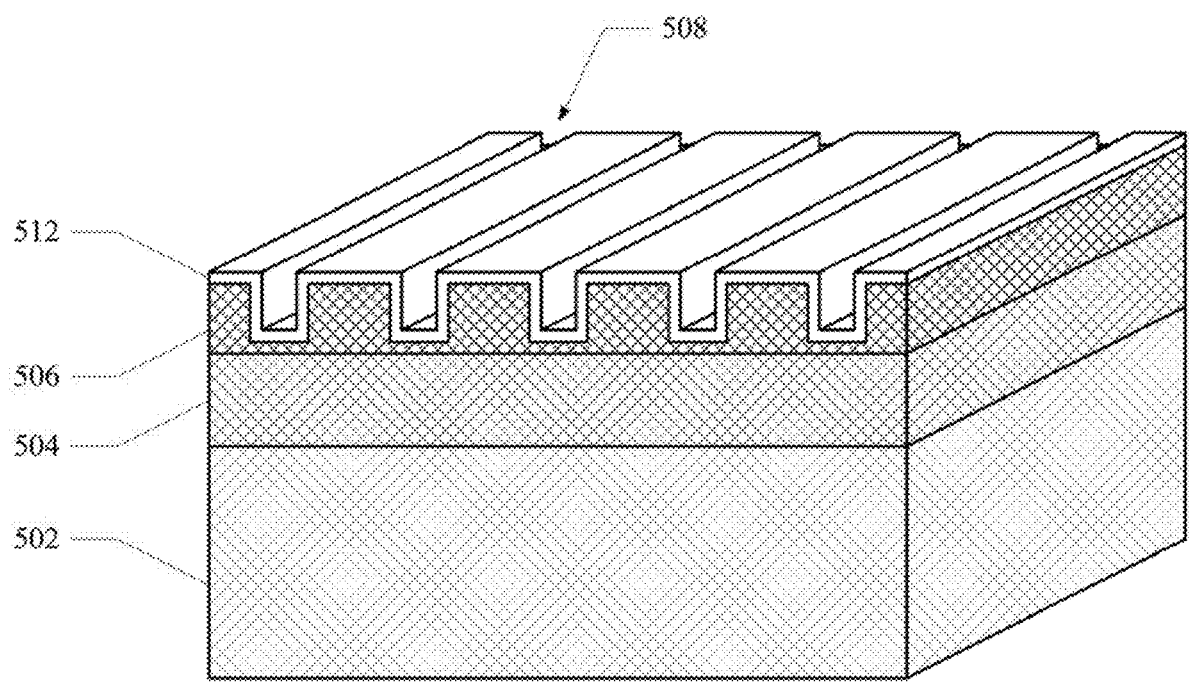
Figure 5D:
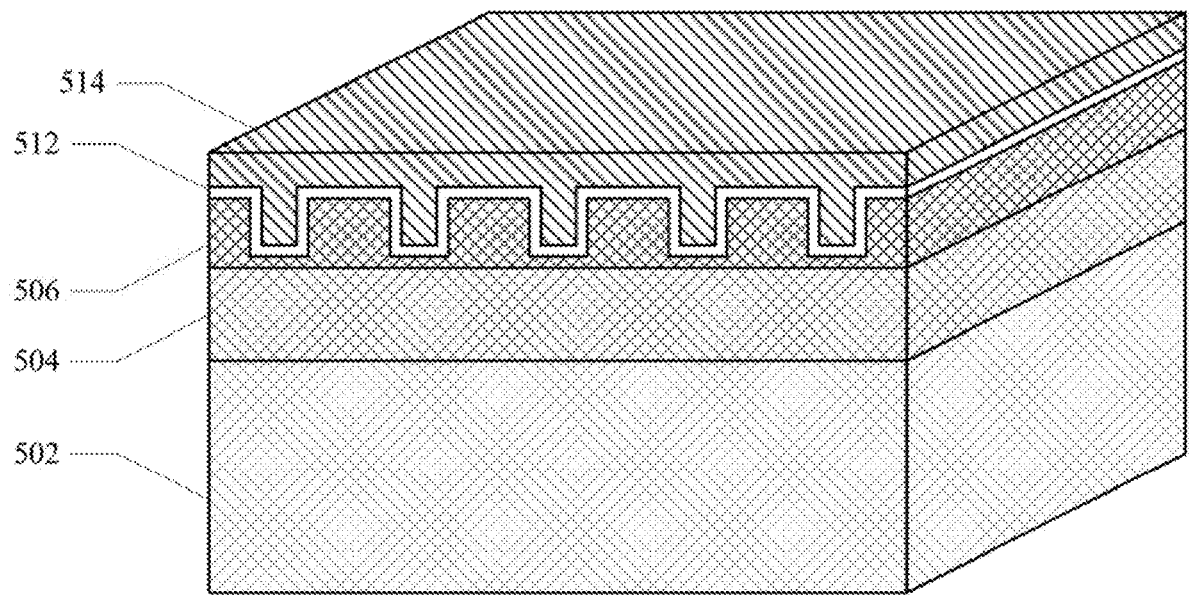

At 425, a plurality of trenches 508 can be formed in the moderately n-doped drift region 506. In one implementation, a mask layer can be deposited and patterned utilizing a photolithograph process. The moderately n-doped crystalline drift layer 506 exposed by the patterned mask layer 510 can be etched to form the plurality of trenches 508, as illustrated in FIG. 5B. The patterned mask layer 510 can then be removed after the plurality of trenches 508 have been etched.

Figure 5E:
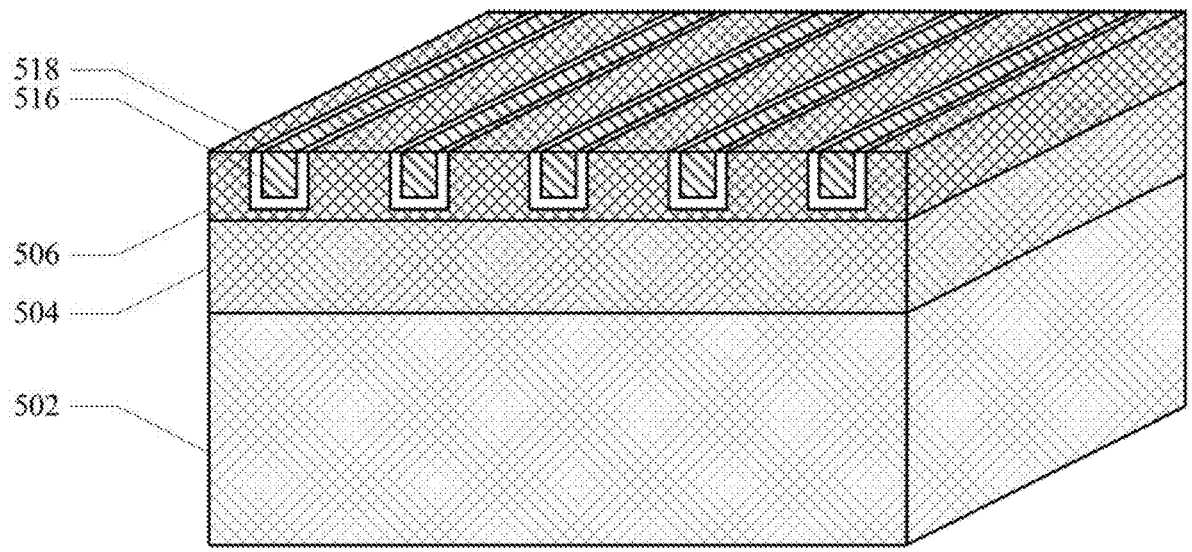
Figure 5F:
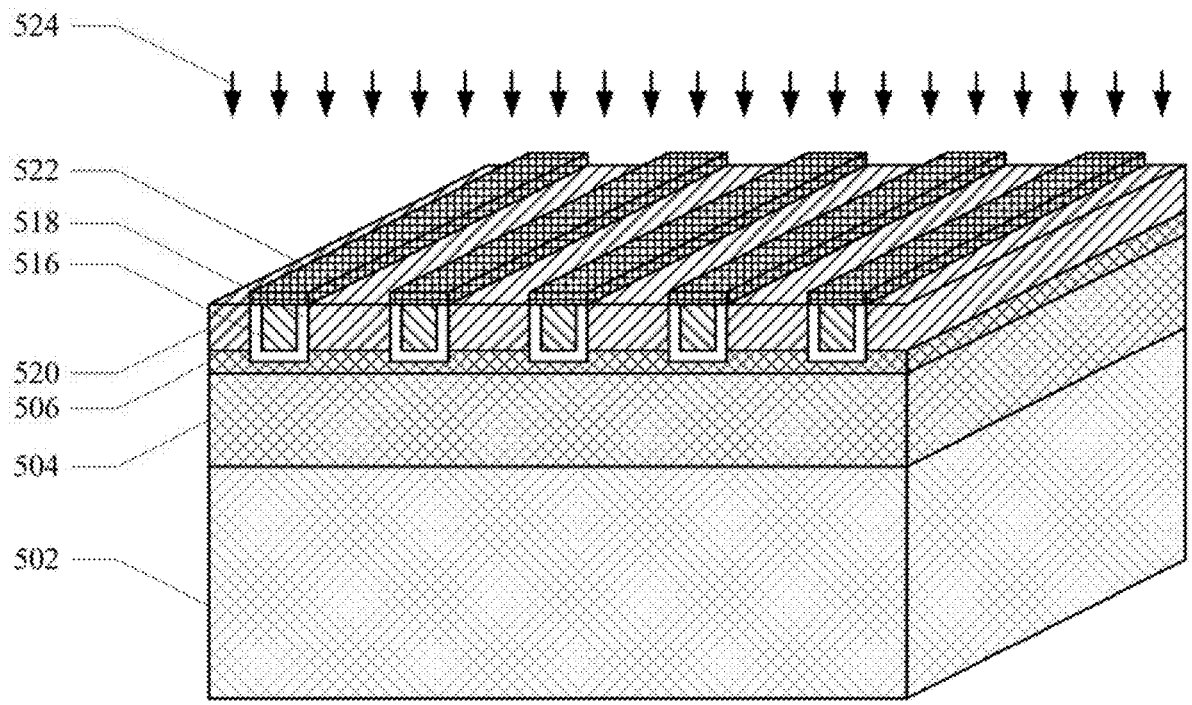
Figure 5G:
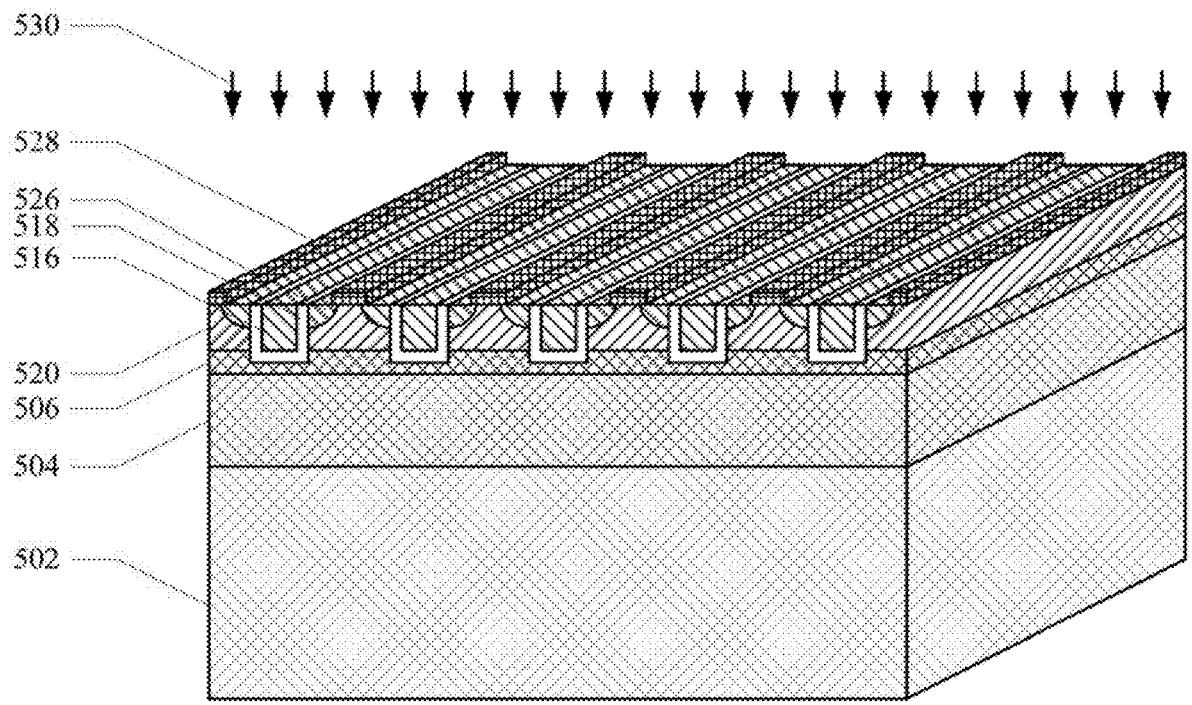
Figure 5H:
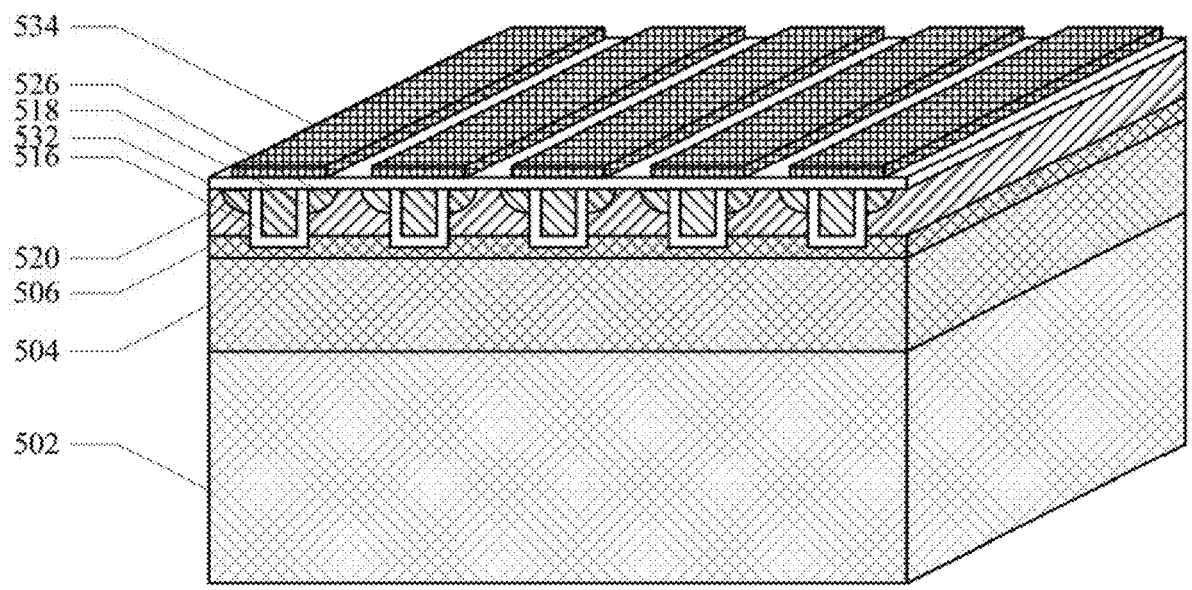
Figure 5I:
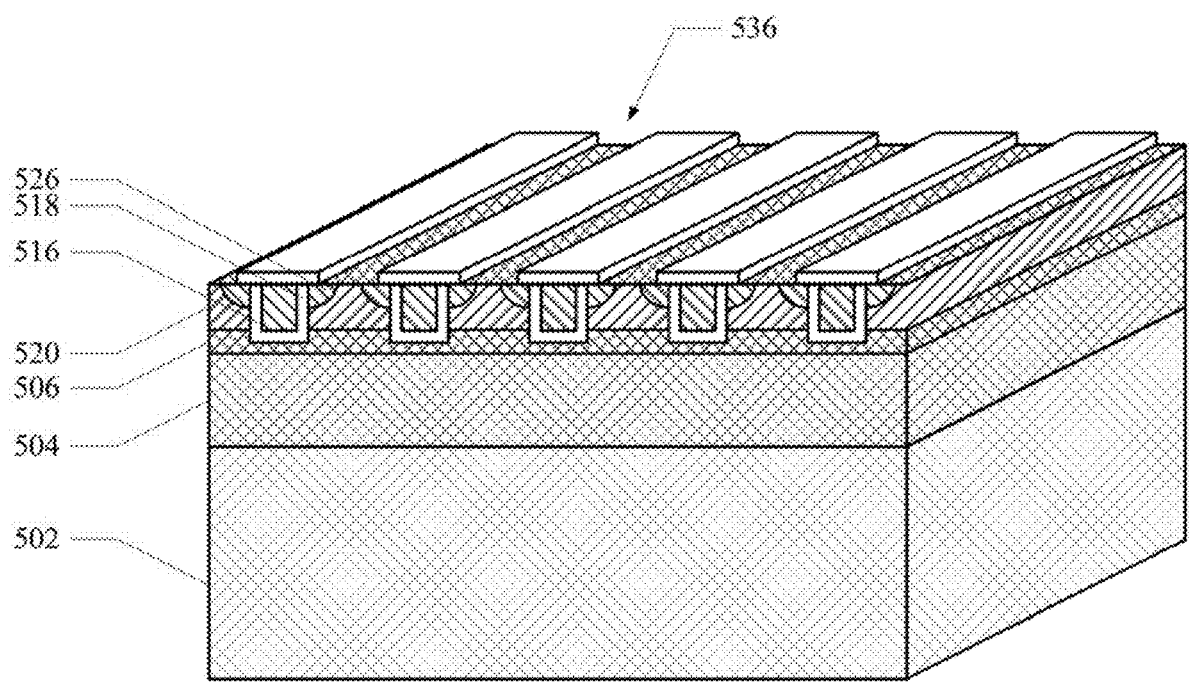
Figure 5J:
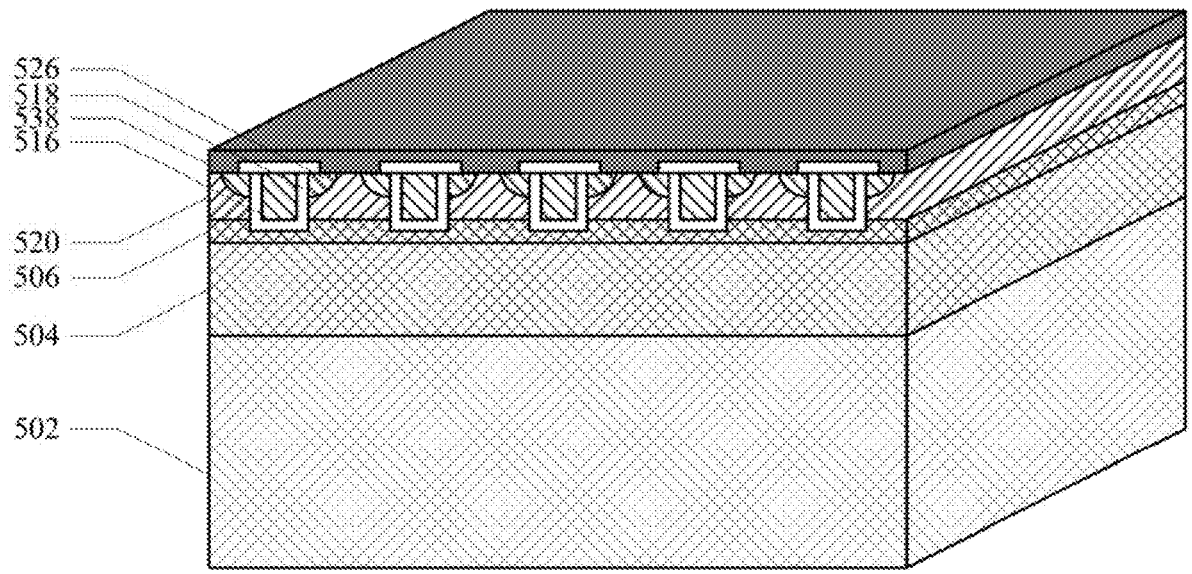
Figure 5K:
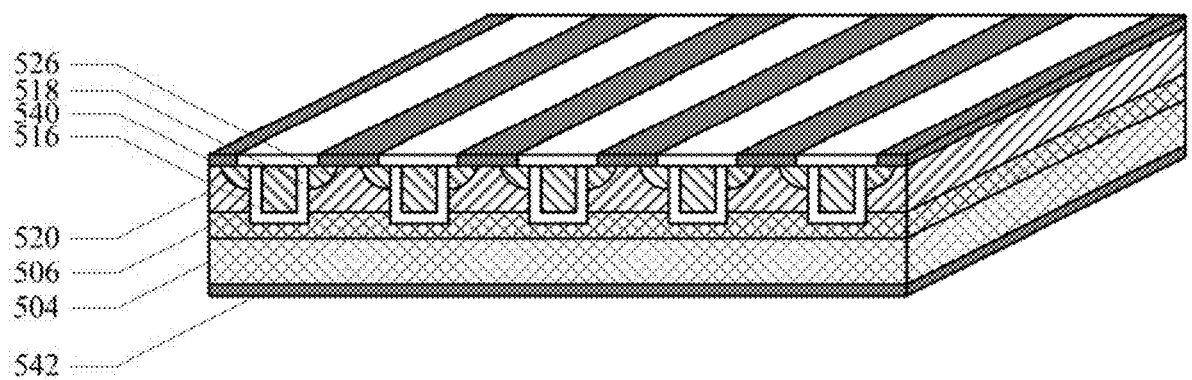

At 430, a plurality of gate dielectric regions can be formed on the walls of the plurality of trenches 508. A plurality of gate regions can also be formed in the plurality of trenches 508, at 435. The plurality of gate dielectric regions can be disposed between the moderately n-doped crystalline drift region 506 and the plurality of gate regions. In one implementation, a gate dielectric layer 512 can be grown on the exposed surface of the moderately n-doped crystalline drift region 506 utilizing a thermal oxidation process to form a silicon oxide layer. A conformal n-doped semiconductor layer 514 can be deposited in the trenches 506 and on top of the gate dielectric layer 512. The n-doped semiconductor layer 514 can be a polysilicon layer doped with phosphorous. The n-doped semiconductor layer 514 and the gate dielectric layer 512 can then be etched back until the n-doped semiconductor and the gate dielectric are removed from the surface of the moderately n-doped crystalline drift region 506 leaving the gate dielectric and the n-doped semiconductor filling the trenches 508 to form the plurality of gate regions 516, and the plurality of gate dielectric regions 518 disposed between the moderately n-doped crystalline drift region 506 and the plurality of gate regions 516, as illustrated in FIG. 5E.

At 440, a plurality of p-doped body regions 520 can be formed in a portion of the moderately n-doped drift region 506, opposite the heavily n-doped crystalline substrate layer 504. In one implementation, a mask layer can be deposited and patterned utilizing a photolithography process. The plurality of p-doped body regions 520 can be formed by implanting a p-dopant, such as Boron (B), 524 into an upper portion of the moderately n-doped crystalline drift region 506 exposed by the patterned mask 522. The patterned mask 522 can then be removed after implanting the plurality of p-doped body regions 520. In one implementation, the plurality of p-doped body regions 520 can extend to the bottom of the plurality of gate regions 516.

At 445, a plurality of n-doped source regions 526 can be formed in a portion of the plurality of p-doped body regions 520 opposite the moderately n-doped crystalline drift region 506. In one implementation, a mask layer 528 can be deposited and patterned utilizing a photolithography process. The plurality of n-doped source regions 526 can be formed by implanting a n-dopant, such as phosphorous, 530 into an upper portion of the p-doped body regions 520 exposed by the patterned mask 528. The patterned mask 528 can then be removed after implanting the plurality of n-doped source regions 526.

At 450, a source-body contact coupled to the plurality of n-doped source regions 526 and the plurality of p-doped body regions 520 can be formed. In one implementation, a dielectric layer 532 can be deposited over the surface of the plurality of gate regions 516, the plurality of gate dielectric regions 518, the plurality of source regions 526 and the plurality of body regions 520. A mask layer 534 can be deposited and patterned utilizing a photolithography process. The portions of the dielectric layer 532 exposed by the patterned mask layer 534 can be selectively etched to form a plurality of source-body contact openings 536 in the dielectric layer 530. The patterned mask 534 can then be removed after forming the source-body contact openings 536 in the dielectric layer 532. A source-body contact layer 538 can be deposited in the source-body contact openings 536 and over the surface of the patterned dielectric layer 532. The source-body-contact layer 538 can be patterned to form a plurality of source-body contacts 540 coupled to the to the plurality of n-doped source regions 526 and the plurality of p-doped body regions 520.

At 455, the lightly n-doped crystalline virtual substrate 502 can be removed from the heavily n-doped crystalline substrate layer 504 leaving the plurality of gate regions 516, the plurality of gate dielectric regions 518, the plurality of p-doped body regions 520, and the plurality of source-body contacts 540 formed about the moderately n-doped crystalline drift region 506. In one implementation, the lightly n-doped crystalline virtual substrate 502 can be removed by a back grinding and polishing process. At 460, the heavily n-doped crystalline substrate layer 504 can optionally be thinned. In one implementation, the back grinding and polishing process can also be utilized to remove a portion of the heavily n-doped crystalline substrate layer 504 from the exposed surface opposite the plurality of gate regions 516, the plurality of gate dielectric regions 518, the plurality of p-doped body regions 520, and the plurality of source-body contacts 540 formed about the moderately n-doped crystalline drift region 506. The heavily doped crystalline substrate layer 504 can be thinned to a final thickness of approximately 25-50 micrometers (μm). The heavily doped crystalline substrate 504 can be thinned to achieve a resistivity of approximately 1 mΩ·cm or less.

At 465, the method of fabricating a semiconductor device can proceed with forming one or more additional regions of the one or more devices about the heavily n-doped crystalline substrate layer 504. In one implementation, one or more additional semiconductor fabrication techniques, such as photolithography, etching, implanting, deposition, and the like can be performed to form one or more regions of one or more devices, such as encapsulation layers, leads and or the like of one or more transistors or other similar devices, in and on the surface of the epitaxial deposited heavily n-doped substrate layer. For example, a drain contact layer 542 can be deposited on the heavily n-doped crystalline substrate layer 504 opposite the plurality of gate regions 516, the plurality of gate dielectric regions 518, the plurality of source regions 526 and the plurality of body regions 520. Additional processes can be performed to form gate contacts, encapsulation layers, and the like.

The exemplary semiconductor device and method of manufacture thereof described and illustrated with reference to FIGS. 4A-4B and FIGS. 5A-5K is included herein to teach the implementation of aspects of the present technology. However, the present technology is not limited thereto and can be readily applied to any number of different semiconductor devices and methods of manufacturing such semiconductor devices.

Figure 6A:
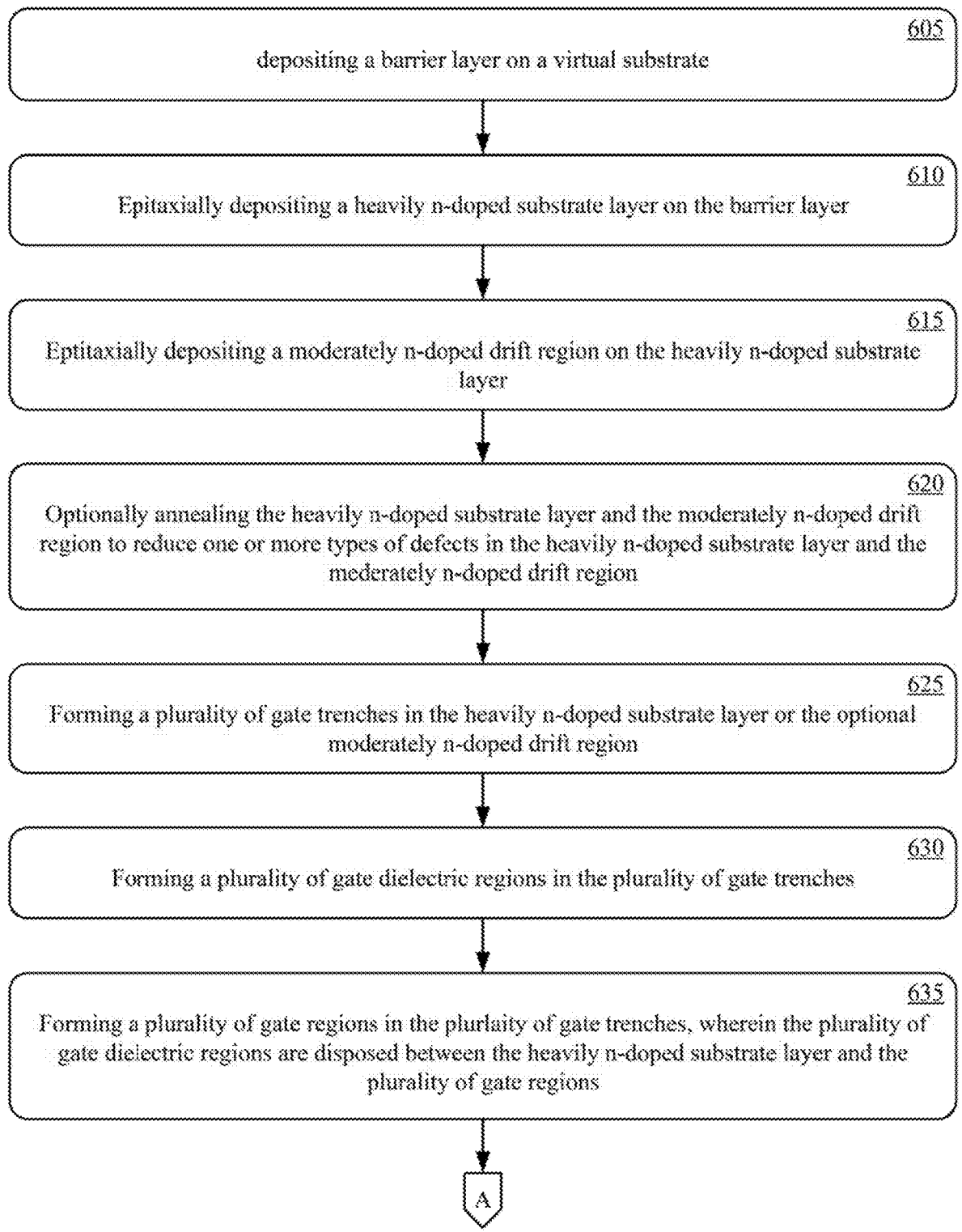
FIGS. 6A and 6B show a method of fabricating a vertical power device, in accordance with aspects of the present technology.
Figure 6B:
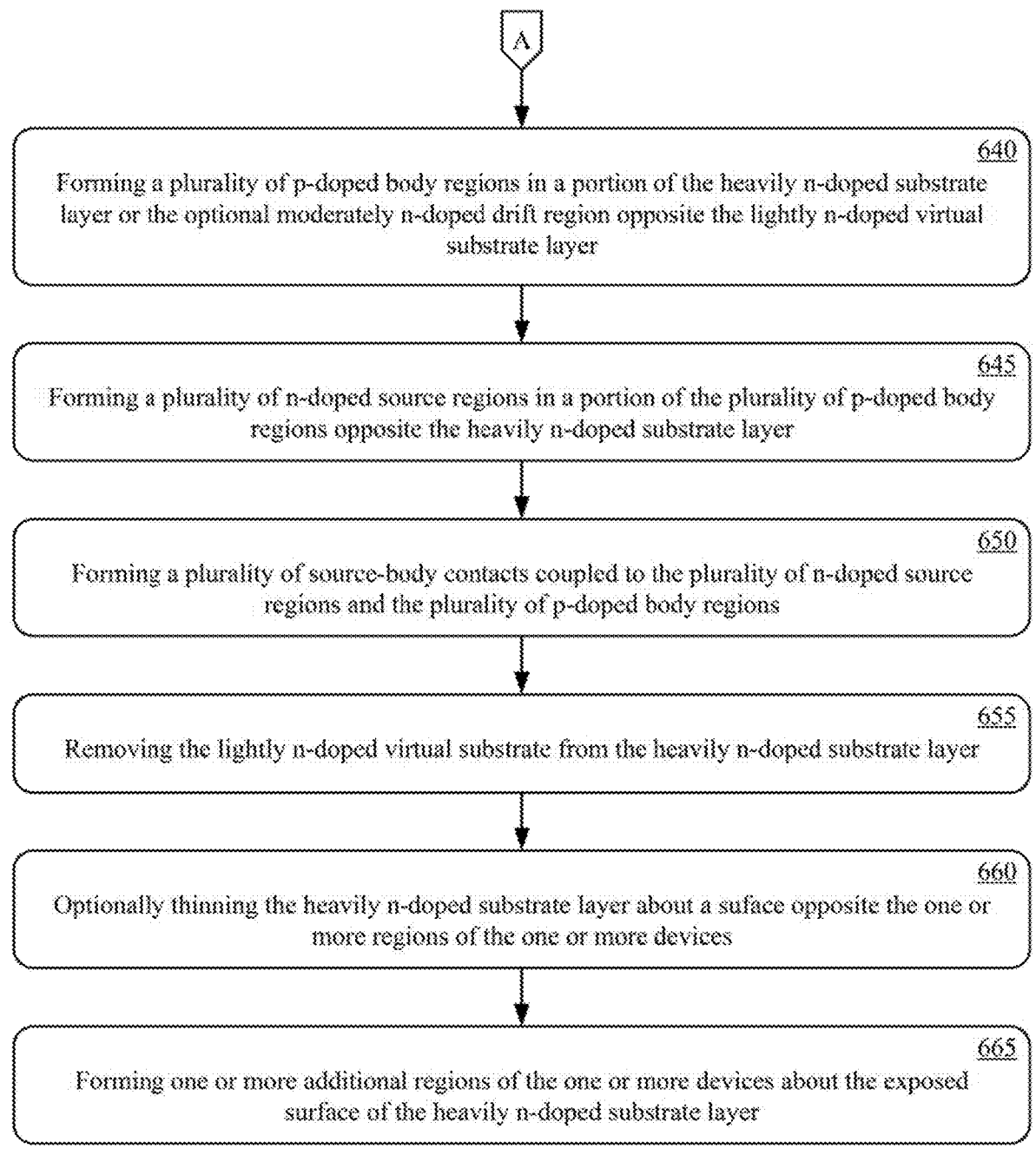

Referring now to FIGS. 6A and 6B, a method of fabricating another exemplary vertical power device, in accordance with aspects of the present technology, is shown. The fabrication method will be further described with reference to FIGS. 7A through 7K, which show portions of an exemplary vertical power device during various stage of fabricating. The vertical power device, in one implementation, can be a Trench Metal Oxide Semiconductor Field Effect Transistor (TMOSFET). The method of fabricating a vertical power device can include depositing a barrier layer 702 on a crystalline virtual substrate 704, at 605. The crystalline virtual substrate 704 can be of any type and can have defects therein. The barrier layer 702 can be configured to prevent propagation of defects from the virtual substrate 704 into a subsequently described heavily doped crystalline substrate layer 706. In one implementation, the barrier layer can be a thin layer of Arsenic (As) or Phosphorus (P). At 610, a heavily n-doped substrate layer 706 can be epitaxially deposited on the buffer layer 702. The term virtual substrate is used herein to convey that the virtual substrate is used to epitaxially grow the heavily doped crystalline substrate layer thereupon, and then is subsequently removed from the finished semiconductor device as further described below.

In one implementation, the crystalline virtual substrate 704 can be a silicon wafer doped with phosphorous. The silicon wafer doped with phosphorous can have a wafer thickness of approximately 625 μm and a resistivity of approximately a few milli-Ohms centimeter (mΩ·cm) or less. In one implementation, the heavily n-doped crystalline substrate 706 can be formed by epitaxially depositing silicon in the presence of phosphorous doping utilizing Chemical Vapor Deposition, Vapor-Phase Epitaxy (VPE), Liquid-Phase Epitaxy (LPE), Molecular Beam Epitaxy (MBE), or other similar epitaxy process. For example, a gas of Silicon Tetrachloride ($SiCl_4$), Silane ($SiH_4$), dichlorosilane ($SiH_2Cl_2$), trichlorosilane ($SiHCl_3$) or the like, along with an impurity gas of Phosphine ($PH_3$) or the like can be used in VPE at a temperature of approximately 1200° C. to deposit a silicon epitaxy layer heavily doped with phosphorous on the buffer layer 702. The epitaxial process can be performed to deposit a silicon epitaxial layer heavily doped with phosphorus to a resistivity of less than 1 (mΩ·cm), and a thickness of approximately 20-50 µm on the buffer layer 702.

At 615, a moderately n-doped crystalline layer 708 can be epitaxially deposited on the heavily n-doped substrate layer 706. The moderately n-doped crystalline layer can be configured to be a drift region. In one implementation, the moderately n-doped crystalline layer can be an epitaxially deposited silicon layer moderately doped with Phosphorous (P).

At 620, the heavily n-doped crystalline substrate layer 706 and the moderately n-doped drift region 708 can optionally be annealed to reduce one or more types of defects in the heavily n-doped crystalline substrate layer 706 and the moderately n-doped drift region 708. In one implementation, the silicon doped with phosphorous virtual substrate 704, the buffer layer 702, the epitaxial deposited silicon heavily doped with phosphorous substrate 706 and the epitaxial deposited silicon moderately doped with phosphorous drift region 708 can be subjected to a thermal cycle of approximately 1000° C. to reduce one or more types of defects in the epitaxial deposited silicon heavily doped with phosphorus substrate layer 706 and epitaxial deposited silicon moderately doped with phosphorous drift region 708.

Figure 7A:
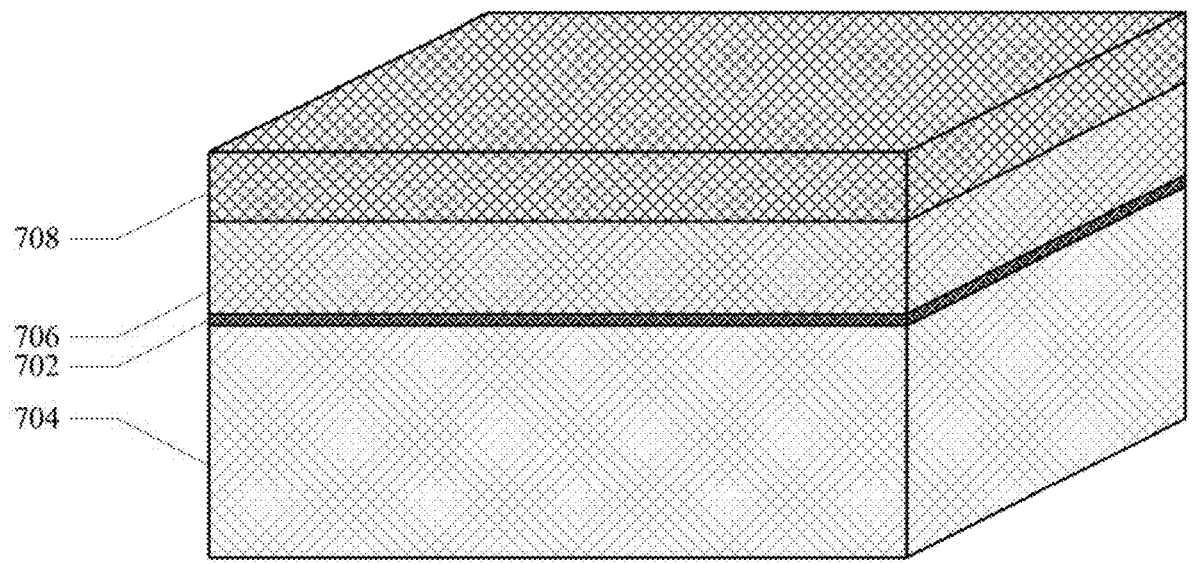
FIGS. 7A through 7K show an exemplary vertical power device fabrication process, in accordance with aspects of the present technology.
Figure 7B:
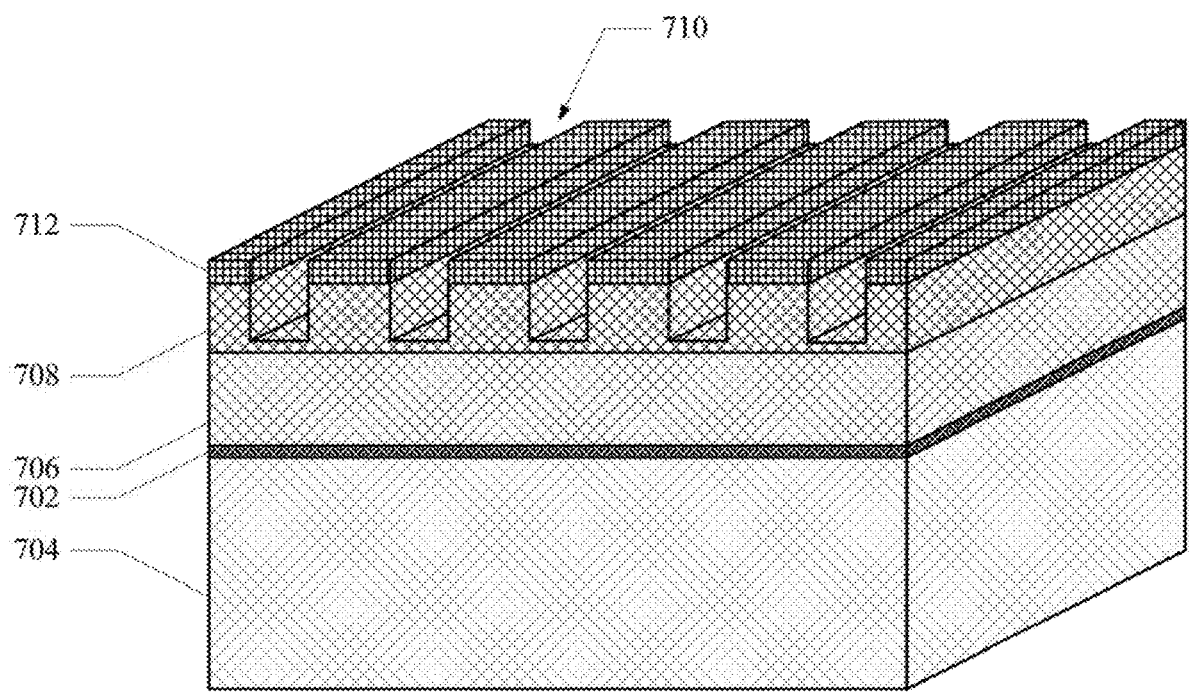
Figure 7C:
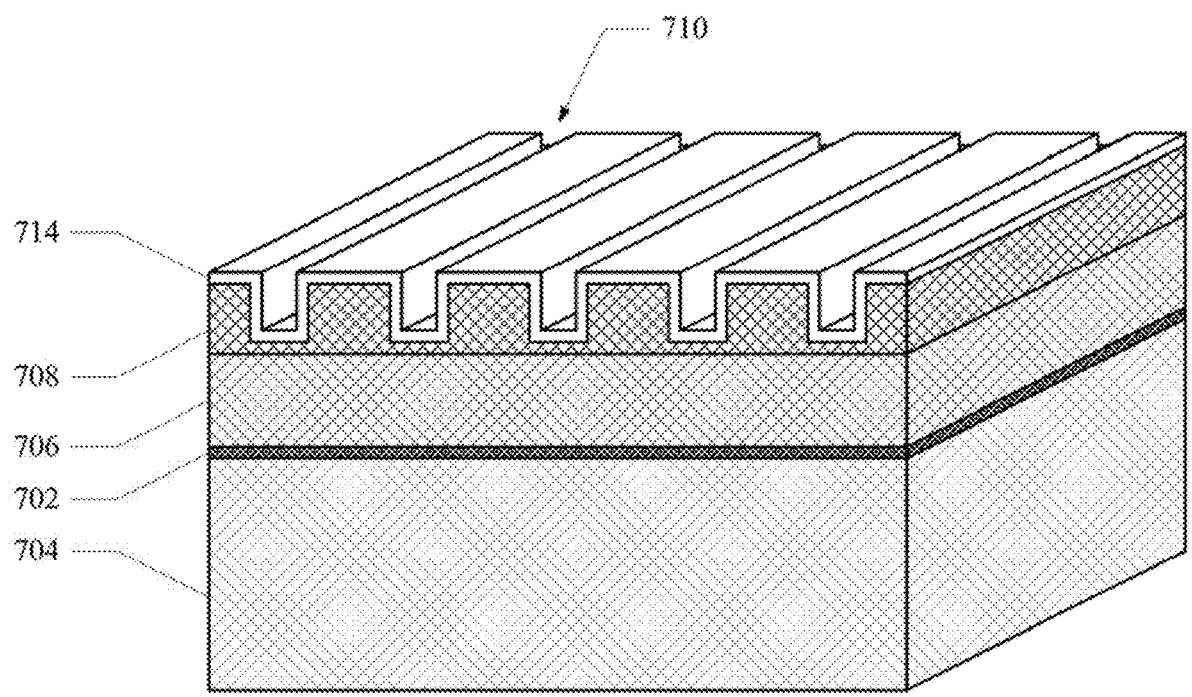
Figure 7D:
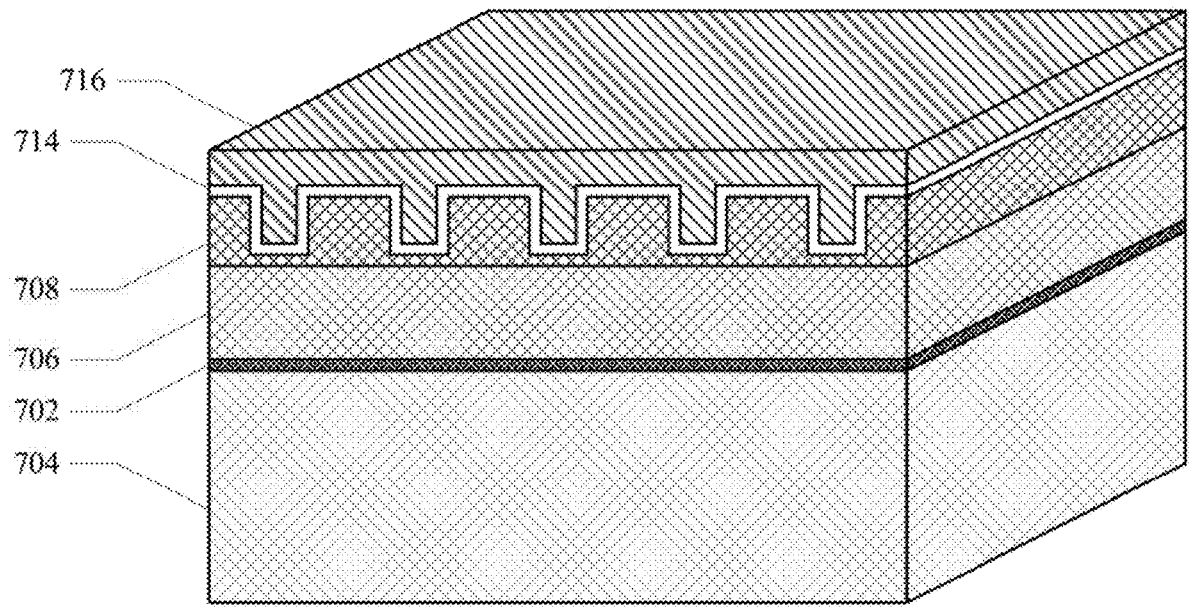

At 625, a plurality of trenches 710 can be formed in the moderately n-doped drift region 708. In one implementation, a mask layer can be deposited and patterned utilizing a photolithograph process. The moderately n-doped crystalline drift layer 708 exposed by the patterned mask layer 712 can be etched to form the plurality of trenches 710, as illustrated in FIG. 7B. The patterned mask layer 712 can then be removed after the plurality of trendies 710 have been etched.

Figure 7E:
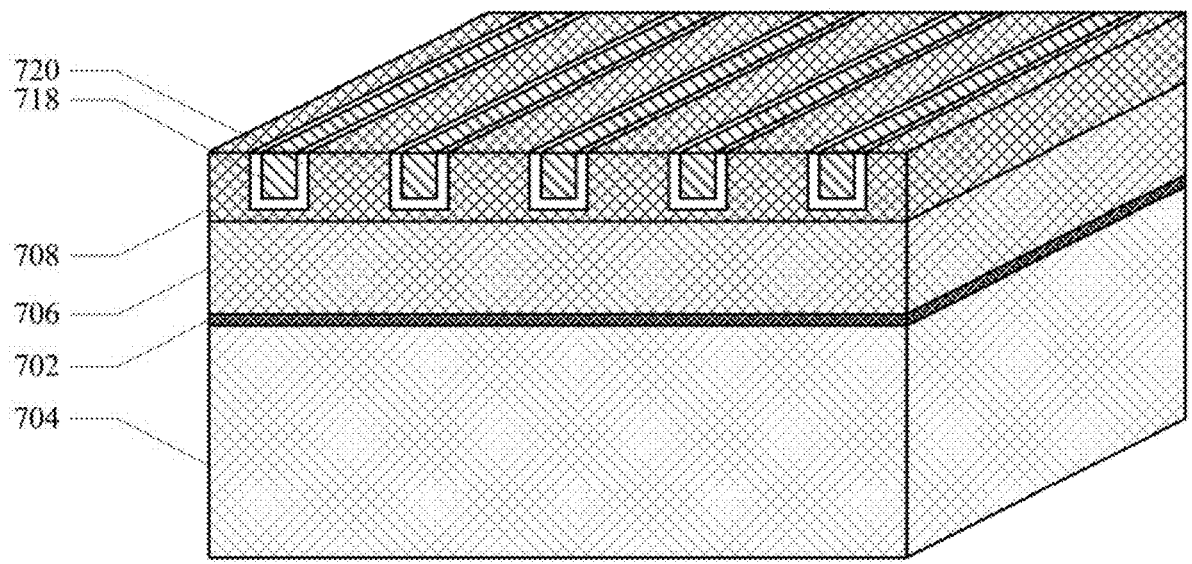
Figure 7F:
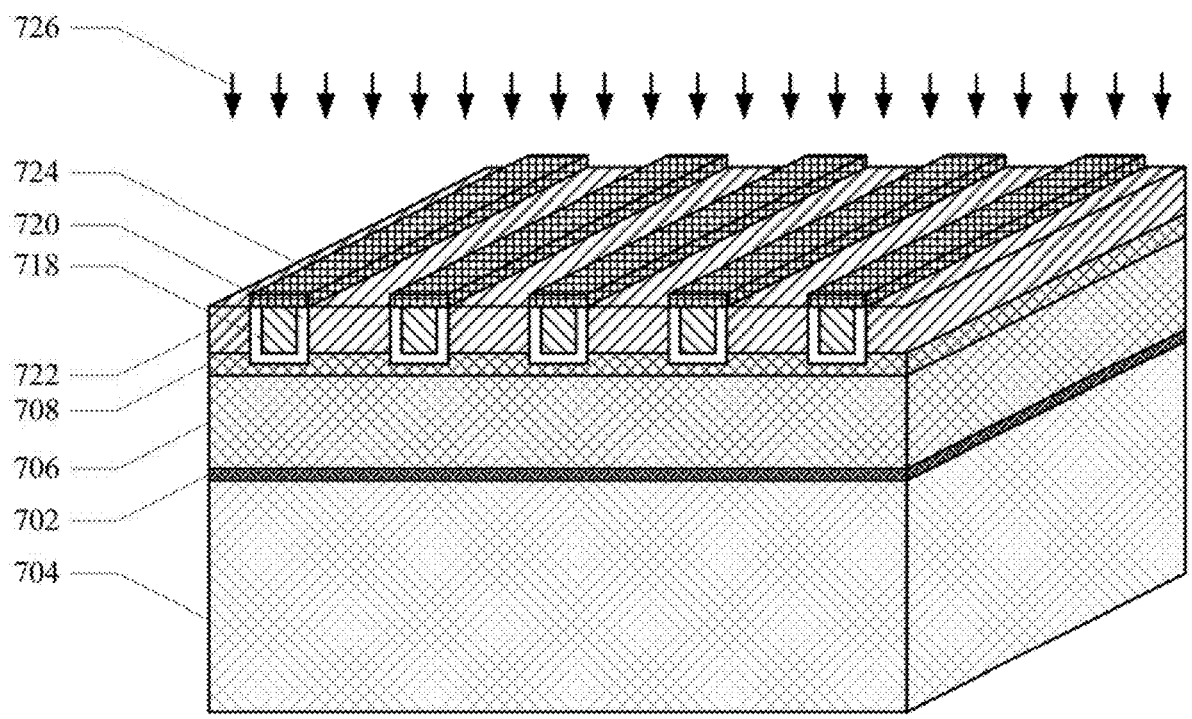
Figure 7G:
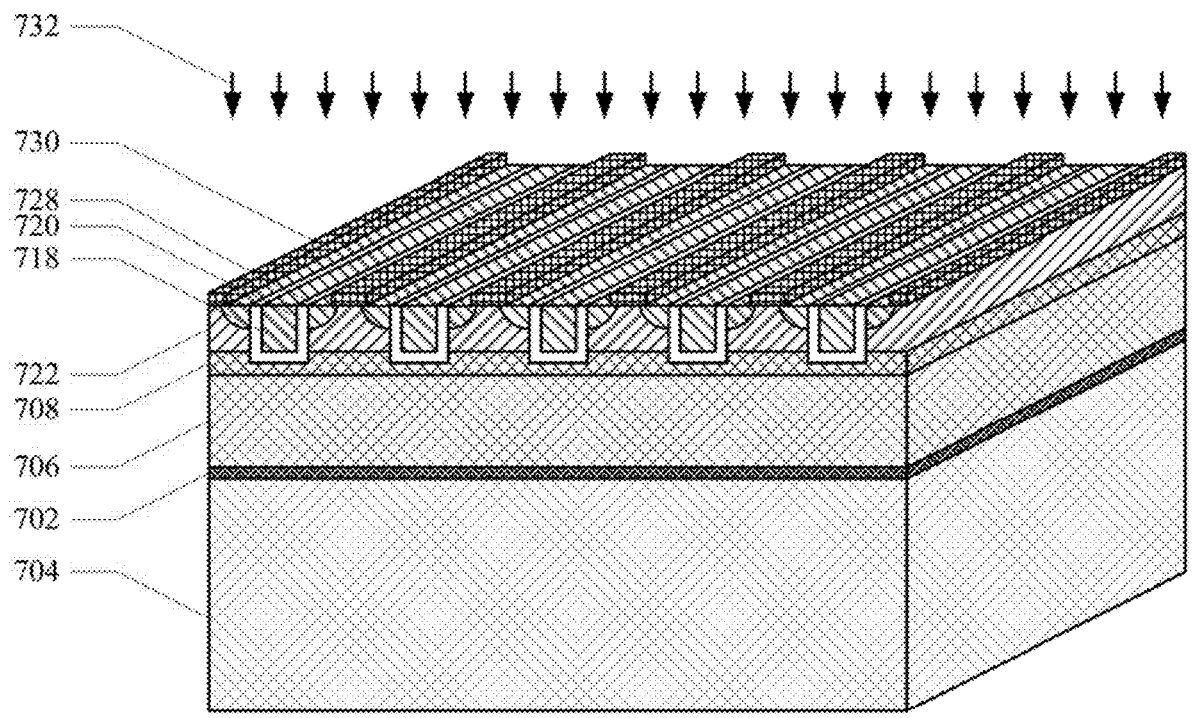
Figure 7H:
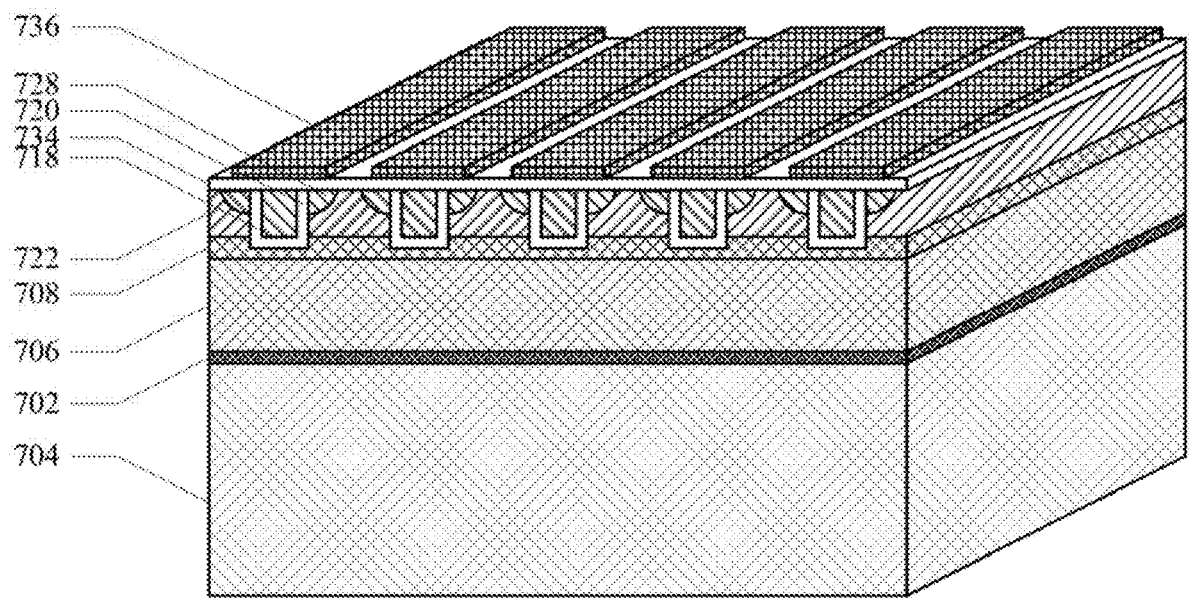
Figure 7I:
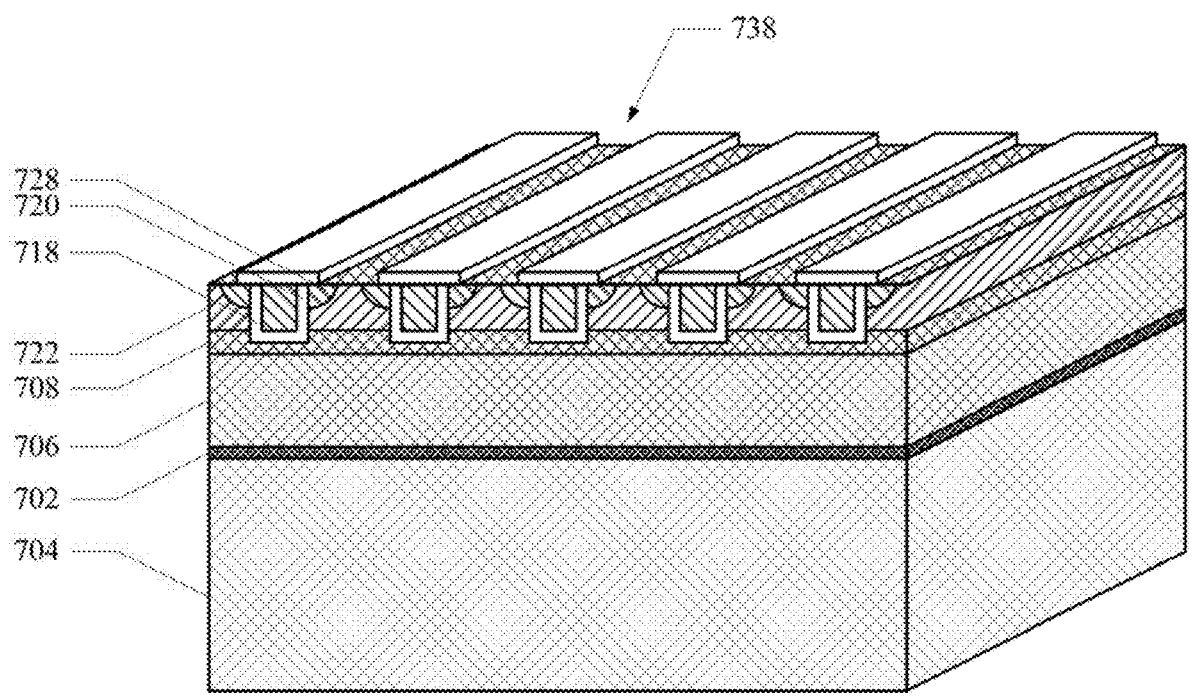
Figure 7J:
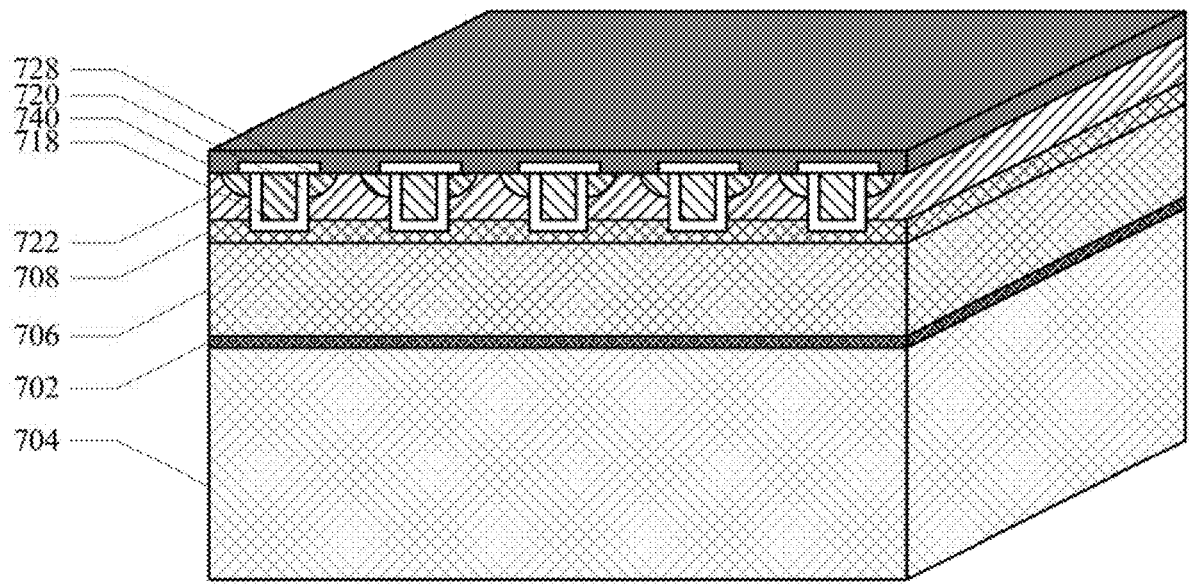
Figure 7K:
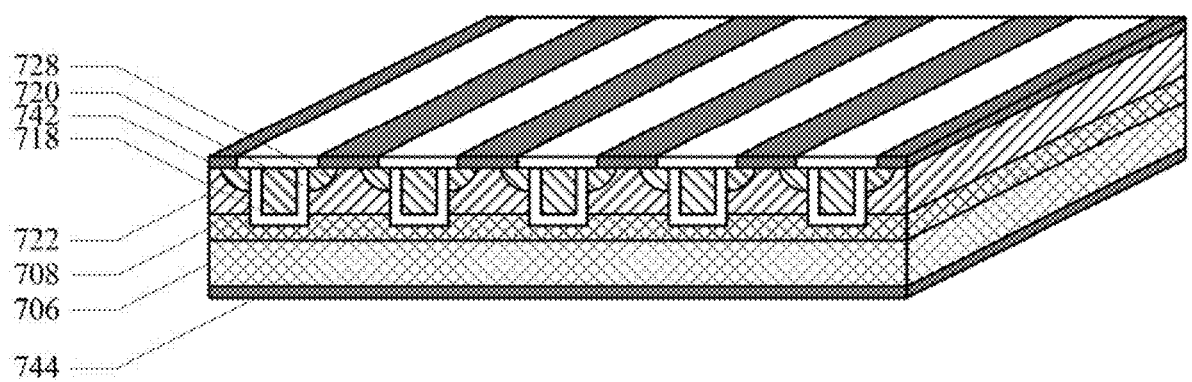

At 630, a plurality of gate dielectric regions can be formed on the walls of the plurality of trenches 710. A plurality of gate regions can also be formed in the plurality of trenches 710, at 635. The plurality of gate dielectric regions can be disposed between the moderately n-doped crystalline drift region 708 and the plurality of gate regions. In one implementation, a gate dielectric layer 714 can be grown on the exposed surface of the moderately n-doped crystalline drift region 708 utilizing a thermal oxidation process to form a silicon oxide layer. A conformal n-doped semiconductor layer 716 can be deposited in the trenches 708 and on top of the gate dielectric layer 714. The n-doped semiconductor layer 716 can be a polysilicon layer doped with phosphorous. The n-doped semiconductor layer 716 and the gate dielectric layer 714 can then be etched back until the n-doped semiconductor and the gate dielectric are removed from the surface of the moderately n-doped crystalline drift region 70S leaving the gate dielectric and the n-doped semiconductor filling the trenches 710 to form the plurality of gate regions 718, and the plurality of gate dielectric regions 720 disposed between the moderately n-doped crystalline drift region 708 and the plurality of gate regions 718, as illustrated in FIG. 7E.

At 640, a plurality of p-doped body regions 722 can be formed in a portion of the moderately n-doped drift region 708, opposite the heavily n-doped crystalline substrate layer 706. In one implementation, a mask layer can be deposited and patterned utilizing a photolithography process. The plurality of p-doped body regions 722 can be formed by implanting a p-dopant, such as Boron (B), 726 into an upper portion of the moderately n-doped crystalline drift region 708 exposed by the patterned mask 724. The patterned mask 724 can then be removed after implanting the plurality of p-doped body regions 722. In one implementation, the plurality of p-doped body regions 722 can extend to the bottom of the plurality of gate regions 718.

At 645, a plurality of n-doped source regions 728 can be formed in a portion of the plurality of p-doped body regions 722 opposite the moderately n-doped crystalline drift region 708. In one implementation, a mask layer 730 can be deposited and patterned utilizing a photolithography process. The plurality of n-doped source regions 728 can be formed by implanting a n-dopant, such as phosphorous, 732 into an upper portion of the p-doped body regions 722 exposed by the patterned mask 730. The patterned mask 730 can then be removed after implanting the plurality of n-doped source regions 728.

At 650, a source-body contact coupled to the plurality of n-doped source regions 728 and the plurality of p-doped body regions 722 can be formed. In one implementation, a dielectric layer 734 can be deposited over the surface of the plurality of gate regions 718, the plurality of gate dielectric regions 720, the plurality of source regions 728 and the plurality of body regions 722. A mask layer 736 can be deposited and patterned utilizing a photolithography process. The portions of the dielectric layer 734 exposed by the patterned mask layer 736 can be selectively etched to form a plurality of source-body contact openings 738 in the dielectric layer 732. The patterned mask 736 can then be removed after forming the source-body contact openings 738 in the dielectric layer 734. A source-body contact layer 740 can be deposited in the source-body contact openings 738 and over the surface of the patterned dielectric layer 734. The source-body-contact layer 740 can be patterned to form a plurality of source-body contacts 742 coupled to the to the plurality of n-doped source regions 728 and the plurality of p-doped body regions 722.

At 655, the crystalline virtual substrate 704 can be removed. Optionally, the buffer layer 702 can also be removed from the heavily n-doped crystalline substrate layer 706, leaving the plurality of gate regions 718, the plurality of gate dielectric regions 720, the plurality of p-doped body regions 722, and the plurality of source-body contacts 742 formed about the moderately n-doped crystalline drift region 708. In one implementation, the crystalline virtual substrate 704 and buffer layer 702 can be removed by a back grinding and polishing process. At 660, the heavily n-doped crystalline substrate layer 706 can optionally be thinned. In one implementation, the back grinding and polishing process can also be utilized to remove a portion of the heavily n-doped crystalline substrate layer 706 from the exposed surface opposite the plurality of gate regions 718, the plurality of gate dielectric regions 720, the plurality of p-doped body regions 722, and the plurality of source-body contacts 742 formed about the moderately n-doped crystalline drift region 708. The heavily doped crystalline substrate layer 706 can be thinned to a final thickness of approximately 25-50 micrometers (µm). The heavily doped crystalline substrate 706 can be thinned to achieve a resistivity of approximately 1 mΩ·cm or less.

At 665, the method of fabricating a semiconductor device can proceed with forming one or more additional regions of the one or more devices about the heavily n-doped crystalline substrate layer 706. In one implementation, one or more additional semiconductor fabrication techniques, such as photolithography, etching, implanting, deposition, and the like can be performed to form one or more regions of one or more devices, such as encapsulation layers, leads and or the like of one or more transistors or other similar devices, in and on the surface of the epitaxial deposited heavily n-doped substrate layer. For example, a drain contact layer 744 can be deposited on the heavily n-doped crystalline substrate layer 706 opposite the plurality of gate regions 718, the plurality of gate dielectric regions 720, the plurality of source regions 728 and the plurality of body regions 722. Additional processes can be performed to form gate contacts, encapsulation layers, and the like.

The exemplary semiconductor device and method of manufacture thereof described and illustrated with reference to FIGS. 6A-6B and FIGS. 7A-7K is included herein to teach the implementation of aspects of the present technology. However, the present technology is not limited thereto and can be readily applied to any number of different semiconductor devices and methods of manufacturing such semiconductor devices.

The heavily doped crystalline substrate 320, 504, 706 is characterized by a low bulk resistivity and a low point defect concentration. The low bulk resistivity is particularly advantageous for use in Trench MOSFETs (TMOSFETs), Vertical MOSFET (VMOS), Vertical Diffused MOSFET (VDMOS), Double-Diffused (DMOS), Power MOSFET (UMOS), and other similar devices that conduct relatively large amounts of currently through the substrate. The low bulk resistivity of the heavily doped crystalline substrate 320, 502, 706 results in a relatively low on resistance of such Trench MOSFETs (TMOSFETs), Vertical MOSFET (VMOS), Vertical Diffused MOSFET (VDMOS), Double-Diffused (DMOS), Power MOSFET (UMOS), and other similar devices. The active regions of French MOSFETs (TMOSFETs), Vertical MOSFET (VMOS), Vertical Diffused MOSFET (VDMOS), Double-Diffused (DMOS), Power MOSFET (UMOS), and other similar devices extends down into the heavily doped crystalline substrate 320, 502, 706. Therefore, point defects distributed throughout a substrate have a higher probability of being proximate an active region of Trench MOSFETs (TMOSFETs), Vertical MOSFET (VMOS), Vertical Diffused MOSFET (VDMOS), Double-Diffused (DMOS), Power MOSFET (UMOS), and other similar devices. In contrast, a lateral transistor architecture where the conduction channel is along the surface of the substrate is typically affected only by point defects proximate the surface of the substrate and not those located down in the substrate away from the active region of the later transistor architecture. Therefore, the low point defect concentration of the heavily doped crystalline substrate 320, 504, 706 results in a lower breakdown voltage failure rate and or lower leakage current for Trench MOSFETs (TMOSFETs), Vertical MOSFET (VMOS), Vertical Diffused MOSFET (VDMOS), Double-Diffused (DMOS), Power MOSFET (UMOS), and other similar devices.

The technique of epitaxially depositing a heavily doped crystalline substrate layer on a lightly doped crystalline virtual substrate advantageously enables the use of a lightly doped crystalline wafer which is less expensive than a heavily doped crystalline wafer. In addition, the density of point defects in a lightly doped crystalline wafer is substantially lower than the density of point defect in a heavily doped crystalline wafer for wafers of approximately the same costs. The point defect density has been found to have a one-to-one relationship to the breakdown voltage failure mode in devices fabricated in the wafer. Accordingly, the process of epitaxially depositing a heavily doped crystalline substrate layer on a lightly doped crystalline virtual substrate advantageously provides for a reduction in the breakdown voltage failure mode in devices fabricated in the wafer, as compared to fabricating the devices in a heavily doped crystalline substrate wafer. The subsequent removal of the lightly doped crystalline virtual substrate also advantageously enables the devices fabricated in the epitaxially deposited heavily doped crystalline substrate layer to achieve on-resistance values comparable to heavily doped crystalline substrates wafer. In addition, the epitaxial deposition of the heavily doped crystalline substrate layer also advantageously enables increased control of the doping profile and or thickness of the epitaxial heavily doped crystalline substrate layer and or additional regions formed in or on the epitaxial heavily doped crystalline substrate layer.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method of fabricating a semiconductor device comprising:
   depositing a heavily doped crystalline semiconductor substrate directly on a lightly doped crystalline virtual semiconductor substrate, wherein the lightly doped crystalline virtual semiconductor substrate is substantially free of crystalline defects, and the deposited heavily doped crystalline semiconductor substrate is substantially free of crystalline defects as a result of the lightly doped crystalline virtual semiconductor substrate being substantially free of crystalline defects;
   forming one or more regions of one or more devices about a surface of the heavily, doped crystalline semiconductor substrate;
   removing the lightly doped crystalline virtual semiconductor substrate from the heavily doped crystalline semiconductor substrate leaving the one or more regions of the one or more devices formed about the heavily doped crystalline semiconductor substrate; and
   annealing the heavily doped crystalline semiconductor substrate deposited on the lightly doped crystalline virtual semiconductor substrate to reduce one or more types of defects in the heavily doped crystalline semiconductor substrate before forming the one or more regions of the one or more devices.

2. The method of fabricating the semiconductor device of claim 1, further comprising:
   thinning the heavily doped crystalline semiconductor substrate after removing the lightly doped crystalline virtual semiconductor substrate.

3. The method of fabricating the semiconductor device of claim 1, further comprising:
   forming one or more additional regions of the one or more devices about the surface of the heavily doped crystalline semiconductor substrate.

4. The method of fabricating the semiconductor device of claim 1, further comprising:
   depositing a barrier layer on the lightly doped crystalline virtual semiconductor substrate before depositing the heavily doped crystalline semiconductor substrate on the lightly doped crystalline virtual semiconductor substrate, wherein the barrier layer is configured to reduce doping diffusion from the heavily doped crystalline semiconductor substrate to the lightly doped crystalline virtual semiconductor substrate.

5. A method of fabricating a semiconductor device comprising:
epitaxially depositing a heavily n-doped semiconductor substrate layer directly on a tightly n-doped virtual semiconductor substrate, wherein the lightly n-doped virtual semiconductor substrate is substantially free of crystalline defects and the epitaxially deposited heavily n-doped semiconductor substrate layer is substantially free of crystalline defects as a result of the lightly n-doped virtual semiconductor substrate being substantially free of crystalline defects;
forming one or more regions of one or more devices about a first surface of the heavily n-doped semiconductor substrate layer; and
removing the lightly n-doped virtual semiconductor substrate from the heavily n-doped semiconductor substrate layer.

6. The method of fabricating the semiconductor device of claim 5, wherein forming the one or more regions of the one or more devices comprises:
forming a plurality of gate trenches in the heavily n-doped semiconductor substrate layer;
forming a plurality of gate dielectric regions in the plurality of gate trenches;
forming a plurality of gate regions in the plurality of gate trenches, wherein the plurality of gate dielectric regions are disposed between the heavily n-doped semiconductor substrate layer and the plurality of gate regions;
forming a plurality of p-doped body regions in a portion of the heavily n-doped substrate layer opposite the lightly n-doped virtual semiconductor substrate; and
forming a plurality of n-doped source regions in a portion of the plurality of p-doped body regions opposite the heavily n-doped semiconductor substrate layer.

7. The method of fabricating the semiconductor device of claim 6, wherein forming the one or more regions of the one or more devices further comprises:
forming a plurality of source-body contacts coupled to the plurality of n-doped source regions and the plurality of p-doped body regions.

8. The method of fabricating the semiconductor device of claim 5, wherein:
the lightly n-doped virtual semiconductor substrate comprises silicon(Si) lightly doped with phosphorous (P); and
the heavily n-doped semiconductor substrate layer comprises silicon heavily doped with phosphorous.

9. The method of fabricating the semiconductor device of claim 8, further comprising:
depositing a barrier layer including arsenic (As) on the lightly n-doped virtual semiconductor substrate before epitaxially depositing the heavily n-doped semiconductor substrate layer.

10. The method of fabricating the semiconductor device of claim 8, wherein the lightly n-doped semiconductor substrate is removed by a back grinding and polishing process.

11. The method of fabricating the semiconductor device of claim 10, further comprising:
thinning the heavily n-doped semiconductor substrate layer about a surface opposite the one or more regions of the one or more devices.

12. The method of fabricating the semiconductor device of claim 11, wherein the heavily n-doped semiconductor substrate layer is thinned by a back grinding and polishing process.

13. The method of fabricating the semiconductor device of claim 5, further comprising:
annealing the heavily n-doped semiconductor substrate layer deposited on the lightly n-doped virtual semiconductor substrate to reduce one or more types of defects in the heavily n-doped semiconductor substrate layer.

14. A method of fabricating a semiconductor device comprising:
depositing a buffer layer on a crystalline virtual semiconductor substrate, wherein the crystalline virtual semiconductor substrate is substantially free of crystalline defects, wherein the buffer layer is not formed from the crystalline virtual semiconductor substrate;
epitaxially depositing a heavily doped crystalline semiconductor substrate on the buffer layer opposite the crystalline virtual semiconductor substrate, wherein the buffer layer is configured to prevent propagation of crystalline defects from the crystalline virtual semiconductor substrate into the heavily doped epitaxially deposited crystalline semiconductor substrate; and
forming one or more regions of one or more devices about a surface of the heavily doped epitaxially deposited crystalline semiconductor substrate.

15. The method of fabricating the semiconductor device of claim 14, further comprising:
removing the crystalline virtual semiconductor substrate from the buffer layer leaving the one or more regions of the one or more devices formed about the surface of the heavily doped crystalline semiconductor substrate.

16. The method of fabricating the semiconductor device of claim 15, further comprising:
removing the buffer layer from the heavily doped crystalline semiconductor substrate.

17. The method of fabricating the semiconductor device of claim 16, further comprising:
thinning the heavily doped crystalline semiconductor substrate after removing the buffer layer.

18. The method of fabricating the semiconductor device of claim 14, wherein depositing the buffer layer comprises epitaxially depositing a semiconductor heavily doped with arsenic (As) or phosphorous (P).

\* \* \* \* \*